(12) United States Patent
Sakurai et al.

(10) Patent No.: US 12,700,836 B2
(45) Date of Patent: Aug. 4, 2026

(54) RADIO-FREQUENCY MODULE AND COMMUNICATION DEVICE

(71) Applicant: Murata Manufacturing Co., Ltd., Nagaokakyo (JP)

(72) Inventors: Satoshi Sakurai, Nagaokakyo (JP); Toshiki Matsui, Nagaokakyo (JP); Yasunobu Yoshizaki, Nagaokakyo (JP); Fuminori Morisawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 454 days.

(21) Appl. No.: 18/204,403

(22) Filed: Jun. 1, 2023

(65) Prior Publication Data

US 2024/0056040 A1     Feb. 15, 2024

(30) Foreign Application Priority Data

Aug. 10, 2022     (JP) .................................. 2022-127968

(51) Int. Cl.
*H03F 3/24*          (2006.01)
*H04B 1/04*          (2006.01)

(52) U.S. Cl.
CPC ............... *H03F 3/245* (2013.01); *H04B 1/04* (2013.01); *H03F 2200/451* (2013.01)

(58) Field of Classification Search
CPC ............... H03F 3/245; H03F 2200/451; H03F 2200/111; H03F 2200/171; H03F 1/0266; H03F 1/0277; H03F 1/56; H03F 2203/21157; H03F 2203/7209; H03F 3/195; H03F 3/72; H03F 1/30; H03F 3/19; H03F 3/21; H04B 1/04; H04B 1/40
See application file for complete search history.

(56) References Cited

U.S. PATENT DOCUMENTS

| | | | | |
|---|---|---|---|---|
| 7,151,759 B1* | 12/2006 | Ryan | .................... | H03G 3/3078 370/335 |
| 2007/0066250 A1* | 3/2007 | Takahashi | ............ | H03G 3/3042 455/127.1 |
| 2020/0195211 A1* | 6/2020 | Zomagboguelou | ..... | H03F 3/245 |
| 2021/0099197 A1* | 4/2021 | Wang | ..................... | H04B 1/401 |
| 2021/0234523 A1* | 7/2021 | Morisawa | ............... | H03F 3/245 |
| 2022/0158596 A1* | 5/2022 | Anderson | ............. | H03M 1/742 |
| 2022/0337201 A1* | 10/2022 | Kim | .......................... | H03F 1/52 |
| 2024/0056040 A1* | 2/2024 | Sakurai | ................. | H03F 1/0277 |

FOREIGN PATENT DOCUMENTS

JP          2007-019582 A          1/2007

* cited by examiner

*Primary Examiner* — Md K Talukder
(74) *Attorney, Agent, or Firm* — XSENSUS LLP

(57)          ABSTRACT

A radio-frequency module includes a power amplifier, a first bias circuit connected to the power amplifier, and a second bias circuit connected to the power amplifier. The first bias circuit includes a register that receives a first digital control signal corresponding to a power mode of the power amplifier and a current generation circuit that generates, based on information in the register, a first bias current, and the second bias circuit includes another register that receives a second digital control signal corresponding to the power mode and a current generation circuit that generates, based on information in the other register, a second bias current.

18 Claims, 13 Drawing Sheets

RADIO-FREQUENCY MODULE AND COMMUNICATION DEVICE

CROSS-REFERENCE TO RELATED APPLICATION

This application claims priority to Japanese Patent Application No. 2022-127968, filed Aug. 10, 2022, the entire contents of which are incorporated herein by reference.

BACKGROUND

1. Field

The present disclosure relates to a radio-frequency module and a communication device.

2. Description of the Related Art

Japanese Unexamined Patent Application Publication No. 2007-19582 discloses a power module (radio-frequency module) provided with a power amplifier circuit, a bias circuit that supplies a bias current to the power amplifier circuit and a pre-charge circuit connected to the bias circuit. The pre-charge circuit generates a current that compensates lack of sensitivity of an output power detection circuit and that has temperature dependence, and adds the current to the bias current.

In the radio-frequency module described above, the bias current is changed so as to correspond to required output power (a power mode) for the power amplifier circuit. However, when the bias current is changed so as to correspond to a large change in the above required output power, it is difficult to rapidly change the bias current with high accuracy so as to correspond to the large change in the required output power even when the pre-charge circuit for constantly supplementing the bias current is added. Thus, there arises a problem that output power characteristics of the power amplifier circuit become unstable against the change in the required output power.

SUMMARY

The present disclosure is made to solve the above problems. For example, a radio-frequency module having stable output characteristics against a change in required output power and a communication device are described.

According to an exemplary aspect, a radio-frequency module is provided with a first power amplifier, a first bias circuit connected to the first power amplifier, and a second bias circuit connected to the first power amplifier, wherein the first bias circuit includes a first register configured to receive a first digital control signal corresponding to a power mode of the first power amplifier and a first current generation circuit configured to generate, based on information in the first register, a first bias current, and the second bias circuit includes a second register configured to receive a second digital control signal corresponding to the power mode and a second current generation circuit configured to generate, based on information in the second register, a second bias current.

According to the present disclosure, it is possible to provide a radio-frequency module having stable output characteristics against a change in required output power and a communication device.

BRIEF DESCRIPTION OF THE DRAWINGS

FIG. 14B is a graph illustrating time response characteristics of the consumed current in a case that, or when, the power mode of the radio-frequency module according to the comparative example changes (when power decreases).

DETAILED DESCRIPTION

Figure 1:
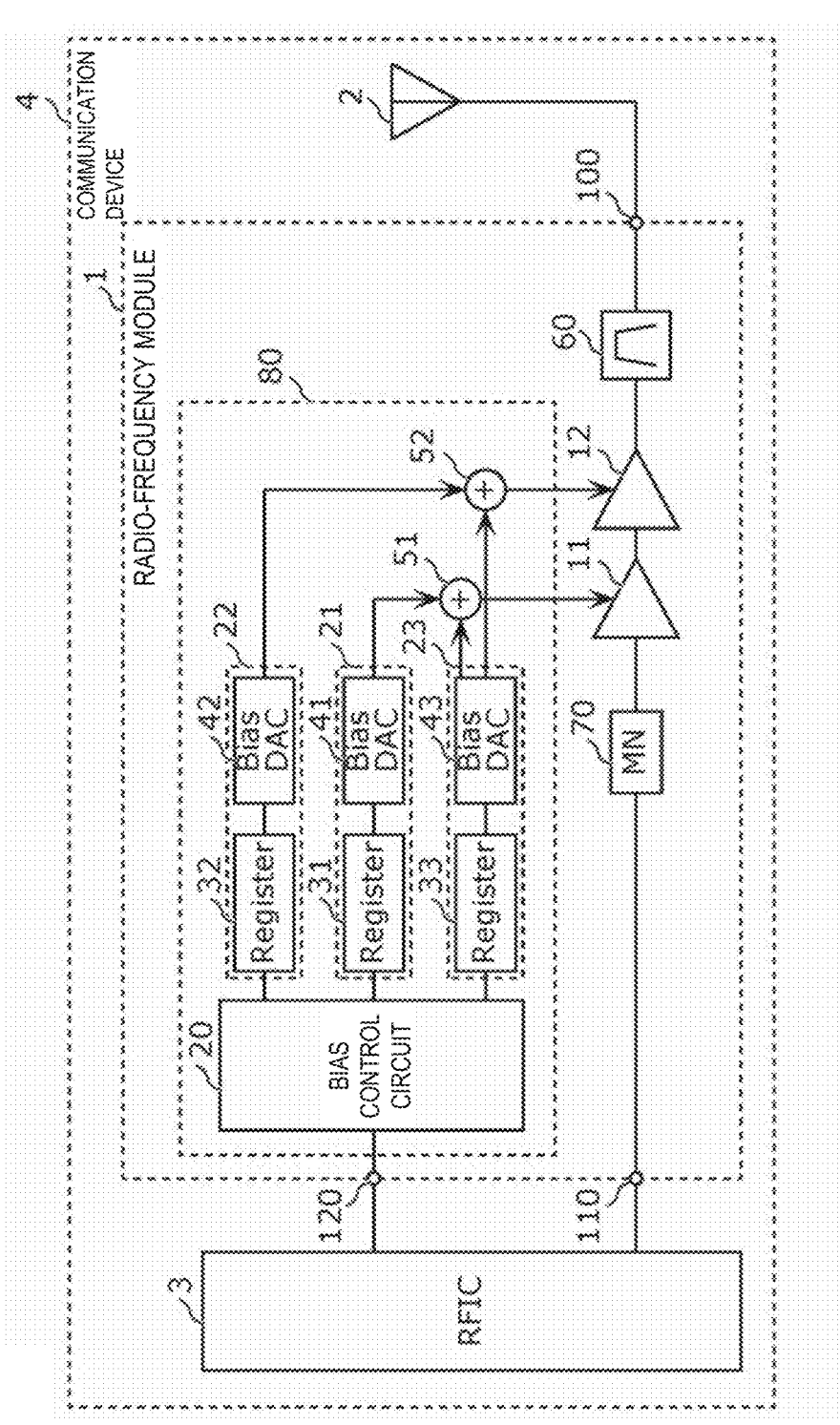
FIG. 1 is a circuit configuration diagram of a radio-frequency module and a communication device according to an exemplary embodiment.

Hereinafter, exemplary embodiments of the present disclosure will be described in detail. Numerical values, shapes, materials, constituent elements, arrangement and connection forms of the constituent elements and the like illustrated in the following exemplary embodiments are mere examples, and are not intended to limit the present disclosure or its claims. Among the constituent elements in the following exemplary embodiments and modifications, constituent elements not recited in the independent claims will be described as optional constituent elements. In addition, sizes or size ratios of the constituent elements illustrated in the figures are not necessarily precise and, in any case, are merely exemplary. In the respective figures, substantially the same configurations are denoted by the same reference numerals, and redundant description may be omitted or simplified.

In addition, in the present disclosure, terms indicating relationships between elements such as parallel and perpendicular, a term indicating a shape of an element such as a rectangular shape and a numerical range represent not only strict meanings but also meanings including a substantially equivalent range, for example, a difference of about several percent.

In addition, in the present disclosure, "connected" means not only a case of being directly connected by a connection terminal and/or a wiring conductor but also a case of being electrically connected via another circuit element. Further, "connected between A and B" means being connected to A and B on a path connecting A and B.

In addition, in the present disclosure, a "path" means a transmission line configured with a wiring line through which a radio-frequency signal propagates, an electrode directly connected to the wiring line, a terminal directly connected to the wiring line or the electrode and the like.

In addition, in the present disclosure, "a component A is disposed in series to a path B" means that both a signal input end and a signal output end of the component A are connected to a wiring line, an electrode or a terminal constituting the path B.

EMBODIMENTS

1. Circuit Configuration of Radio-Frequency Module and Communication Device

A circuit configuration of a radio-frequency module 1 and a communication device 4 according to an exemplary embodiment will be described with reference to FIG. 1. FIG. 1 is a circuit configuration diagram of the radio-frequency module 1 and the communication device 4 according to the exemplary embodiment.

1.1 Circuit Configuration of Communication Device 4

The communication device 4 corresponds to a so-called user terminal (UE: User Equipment) and is typically a mobile phone, a smartphone, a tablet computer or the like. Such a communication device 4 is provided with the radio-frequency module 1, an antenna 2 and an RF signal processing circuit (RFIC: Radio Frequency Integrated Circuit) 3.

The radio-frequency module 1 transmits a radio-frequency signal between the antenna 2 and the RFIC 3. A circuit configuration of the radio-frequency module 1 will be described later.

The antenna 2 is connected to an antenna connection terminal 100 of the radio-frequency module 1. The antenna 2 receives a radio-frequency signal from the radio-frequency module 1 and outputs the radio-frequency signal outward.

The RFIC 3 is an example of a signal processing circuit that processes a radio-frequency signal. To be more specific, the RFIC 3 performs signal processing of a transmission signal received from a baseband signal processing circuit (BBIC: Baseband Integrated Circuit: not illustrated) by up-conversion or the like and outputs a transmission signal generated by the signal processing to a transmission path of the radio-frequency module 1. In addition, the RFIC 3 performs signal processing of a reception signal received via a reception path of the radio-frequency module 1 by down-conversion or the like and outputs a reception signal generated by the signal processing to the BBIC.

Further, the RFIC 3 controls a bias control circuit 20 that the radio-frequency module 1 has. Note that some or all of control functions of the RFIC 3 may be implemented outside the RFIC 3, for example, may be included in the BBIC or the radio-frequency module 1.

Note that in the communication device 4 according to the exemplary embodiment, the antenna 2 may be omitted without departing from the scope of the present disclosure.

1.2 Circuit Configuration of Radio-Frequency Module 1 According to the Exemplary Embodiment Next, the circuit configuration of the radio-frequency module 1 will be described. As illustrated in FIG. 1, the radio-frequency module 1 is provided with power amplifiers 11 and 12, the bias control circuit 20, bias circuits 21, 22 and 23, adders 51 and 52, a filter 60, a matching circuit 70, the antenna connection terminal 100, a signal input terminal 110 and a control signal terminal 120.

The power amplifier 11 is an example of a first power amplifier, is connected between the signal input terminal 110 and the antenna connection terminal 100 and is capable of amplifying a radio-frequency signal in a first band.

The power amplifier 12 is an example of a second power amplifier, is connected between the signal input terminal 110 and the antenna connection terminal 100 and is capable of amplifying a radio-frequency signal in the first band. The power amplifier 12 is cascade-connected to the power amplifier 11.

The power amplifier 11 corresponds to a drive amplifier (pre-stage amplifier) of the radio-frequency module 1, and the power amplifier 12 corresponds to a power amplifier (post-stage amplifier) of the radio-frequency module 1.

Each of the power amplifiers 11 and 12 has an amplification transistor, which can be, for example, a bipolar transistor such as a heterojunction bipolar transistor (HBT) or a field effect transistor such as a metal-oxide-semiconductor field effect transistor (MOSFET). Examples of a material of the amplification transistor include Si, GaAs, SiGe and GaN.

Note that the radio-frequency module 1 need not be provided with the power amplifier 11, the bias circuit 21 and the adder 51. In this case, the power amplifier 12 corresponds to the first power amplifier, and the bias circuit 22 corresponds to a first bias circuit.

Further, the radio-frequency module 1 need not be provided with the power amplifier 12, the bias circuit 22 and the adder 52. In this case, the power amplifier 11 corresponds to the first power amplifier, and the bias circuit 21 corresponds to the first bias circuit.

The bias circuit 21 is an example of the first bias circuit and is connected to the power amplifier 11. The bias circuit 21 has a register 31 and a current generation circuit 41.

The register 31 is an example of a first register and receives a first digital control signal corresponding to a power mode of the power amplifier 11 from the bias control circuit 20.

Note that the power mode is power that the communication device 4 is to output (may be referred to as required output power) and indicates, for example, power required from a base station. Examples of the power mode include 23 dBm (a high-power mode) and 10 dBm (a low-power mode).

The current generation circuit 41 is an example of a first current generation circuit and is configured to generate, based on information in the register 31, a first bias current. To be specific, the current generation circuit 41 has a first digital-to-analog (DA) converter and a first current source circuit. The first DA converter converts digital information indicating magnitude of the first bias current stored in the register 31 into an analog signal, and the first current source circuit generates, based on the analog signal converted by the first DA converter, the first bias current. According to the configuration of the current generation circuit 41, it is possible to convert the digital information indicating the magnitude of the bias current stored in the register 31 into an analog signal.

The bias circuit 22 is an example of a third bias circuit and is connected to the power amplifier 12. The bias circuit 22 has a register 32 and a current generation circuit 42.

The register 32 is an example of a third register and receives a third digital control signal corresponding to a power mode of the power amplifier 12 from the bias control circuit 20.

The current generation circuit 42 is an example of a third current generation circuit and is configured to generate, based on information in the register 32, a third bias current. To be specific, the current generation circuit 42 has a third DA converter and a third current source circuit. The third DA converter converts a digital signal indicating magnitude of the third bias current stored in the register 32 into an analog signal, and the third current source circuit generates, based on the analog signal converted by the third DA converter, the third bias current.

The bias circuit 23 is an example of a second bias circuit and is connected to the power amplifiers 11 and 12. The bias circuit 23 has a register 33 and a current generation circuit 43.

The register 33 is an example of a second register and, from the bias control circuit 20, receives a second digital control signal corresponding to the power mode of the power amplifier 11 and receives a fourth digital control signal corresponding to the power mode of the power amplifier 12.

The current generation circuit 43 is an example of a second current generation circuit and is configured to generate, based on information in the register 33, a second bias current. To be specific, the current generation circuit 43 has a second DA converter and a second current source circuit. The second DA converter converts a digital signal indicating magnitude of the second bias current stored in the register 33 into an analog signal, and the second current source circuit generates, based on the analog signal converted by the second DA converter, the second bias current. According to the configuration of the current generation circuit 43, it is possible to convert the digital information indicating the magnitude of the bias current stored in the register 33 into an analog signal.

The adder 51 combines (adds) the first bias current outputted from the bias circuit 21 with the second bias current outputted from the bias circuit 23. The adder 52 combines (adds) the third bias current outputted from the bias circuit 22 with the second bias current outputted from the bias circuit 23.

Note that each of the adders 51 and 52 only needs to have a function of combining (adding) two bias currents. From this point of view, in a case that, or when, the bias circuit 23 is connected to a first node on a path connecting the power amplifier 11 and the bias circuit 21, the first node corresponds to the adder 51. Further, in a case that, or when, the bias circuit 23 is connected to a second node on a path connecting the power amplifier 12 and the bias circuit 22, the second node corresponds to the adder 52. Note that according to this configuration, since the first bias current and the second bias current are combined at the node on the above path and supplied to the power amplifiers 11 and 12, the number of bias supply terminals provided in each of the power amplifiers 11 and 12 can be made one.

The bias control circuit 20 is an example of a control circuit and is connected between the control signal terminal 120 and the bias circuits 21, 22 and 23. The bias control circuit 20 is configured to receive, from the RFIC 3, a control signal corresponding to required output power that the power amplifiers 11 and 12 are to output, and based on the control signal, supply the first digital control signal to the register 31, supply the second digital control signal and the fourth digital control signal to the register 33 and supply the third digital control signal to the register 32. As each of the first digital control signal to the fourth digital control signal, for example, a control signal according to a source synchronization method for transmitting a data signal and a clock signal can be used, but the present disclosure is not limited thereto. For example, a clock embedded method may be applied to the first digital control signal to the fourth digital control signal.

Accordingly, one bias control circuit 20 controls both two of the bias circuits 21 and 23 and also controls both the bias circuits 22 and 23, thus the two bias circuits can be synchronized with each other in activation timing. That is, since the magnitude and output timing of the second bias current can be made to correspond to the first bias current or the third bias current, output from the power amplifiers 11 and 12 can be stabilized.

The filter 60 is connected between the antenna connection terminal 100 and the power amplifier 12 and has a pass band including the first band. The matching circuit 70 is connected between the signal input terminal 110 and the power amplifier 11 and achieves impedance matching between the RFIC 3 and the power amplifier 11. Note that the radio-frequency module 1 need not be provided with the filter 60 and the matching circuit 70.

The bias circuits 21, 22 and 23 and the bias control circuit 20 are included in one semiconductor IC 80. Accordingly, the radio-frequency module 1 can be reduced in size.

Note that the semiconductor IC 80 may include the power amplifiers 11 and 12. Accordingly, the radio-frequency module 1 can be further reduced in size.

Figure 2:
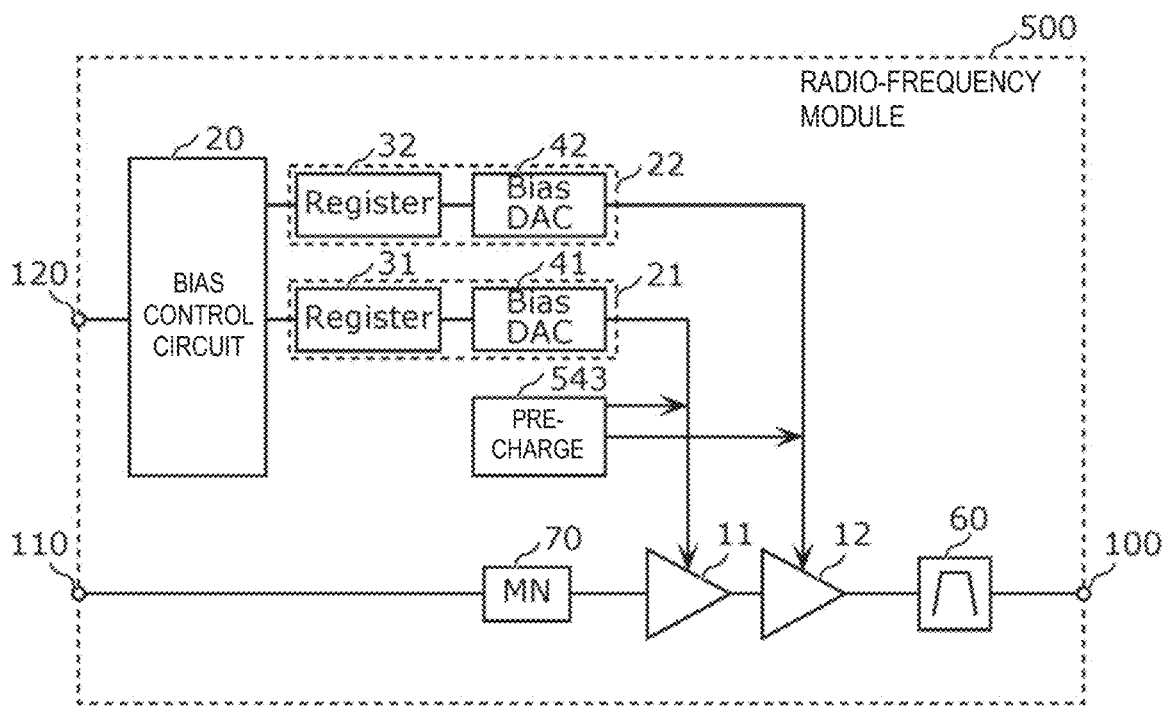
FIG. 2 is a circuit configuration diagram of a radio-frequency module according to a comparative example.

1.3 Circuit Configuration of Radio-Frequency Module 500 According to Comparative Example Next, a circuit configuration of a radio-frequency module 500 according to a comparative example will be described. As illustrated in FIG. 2, the radio-frequency module 500 according to the comparative example is provided with the power amplifiers 11 and 12, the bias control circuit 20, the bias circuits 21 and 22, a pre-charge circuit 543, the filter 60, the matching circuit 70, the antenna connection terminal 100, the signal input terminal 110 and the control signal terminal 120. The radio-frequency module 500 according to the comparative example is different from the radio-frequency module 1 according to the embodiment in that the pre-charge circuit 543 is disposed instead of the bias circuit 23. Hereinafter, with respect to the radio-frequency module 500 according to the comparative example, a description of the same points as those of the radio-frequency module 1 according to the embodiment will be omitted, and different points will be mainly described.

The pre-charge circuit 543 is connected to the power amplifiers 11 and 12. The pre-charge circuit 543 steadily supplies currents to the power amplifiers 11 and 12 without receiving a change in the required output power of the power amplifiers 11 and 12 from the bias control circuit 20. Accordingly, even in a case that, or when, bias currents supplied to the power amplifiers 11 and 12 increase or decrease, currents are steadily superimposed from the pre-charge circuit 543, thus a rapid change in the bias current can be suppressed.

1.4 Comparison of Output Characteristics of Radio-Frequency Modules According to the Exemplary Embodiment and Comparative Example Next, output characteristics of the radio-frequency module 1 according to the exemplary embodiment and the radio-frequency module 500 according to the comparative example will be compared.

In the radio-frequency module 500 according to the comparative example, one bias circuit and one pre-charge circuit 543 are connected to one power amplifier. As described above, the pre-charge circuit 543 steadily supplies currents to the power amplifiers 11 and 12 without receiving a change in the required output power of the power amplifiers 11 and 12 from the bias control circuit 20.

On the other hand, in the radio-frequency module 1 according to the exemplary embodiment, two bias circuits are connected to one power amplifier, and each of the two bias circuits receives, from the bias control circuit 20, a digital control signal corresponding to a change in the required output power (power mode) of the power amplifiers 11 and 12. Thus, each of the power amplifiers 11 and 12 can receive two types of bias currents corresponding to the required output power (power modes).

Figure 3:
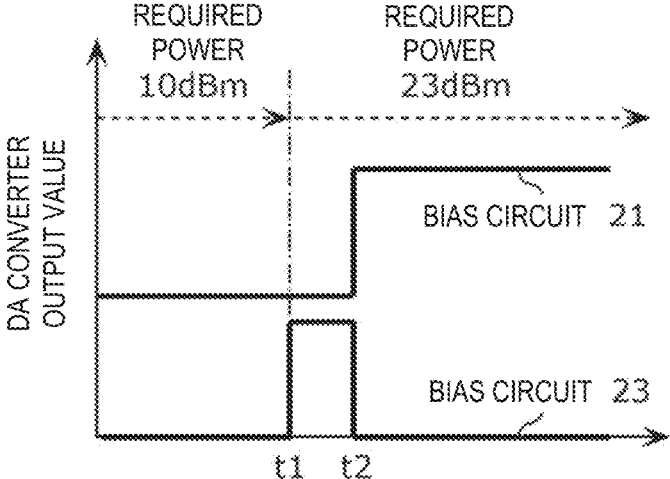
FIG. 3 is a graph presenting an example of supply timing of a bias current of the radio-frequency module according to the exemplary embodiment.

FIG. 3 is a graph presenting an example of supply timing of the bias current of the radio-frequency module 1 according to the exemplary embodiment. The figure shows time response characteristics of an output value of the DA converter of each of the bias circuits 21 and 23 in the radio-frequency module 1.

As shown in FIG. 3, in a case that, or when, a required output power value for the power amplifier 11 changes from 10 dBm to 23 dBm (when power increases), for example, the bias control circuit 20 outputs the second digital control signal to the register 33 at or immediately before a time t1 (first timing) at which the required output power (power mode) is switched. Accordingly, an analog signal corresponding to the second bias current is outputted from the second DA converter of the bias circuit 23. Note that the analog signal corresponding to the second bias current outputted from the second DA converter is optimized corresponding to the required output power value. That is, the second digital control signal is a signal corresponding to the required output power.

Next, the bias control circuit 20 outputs the first digital control signal to the register 31 at a time t2 (second timing) after elapse of a predetermined time from the time t1 (first timing). Accordingly, an analog signal corresponding to the first bias current is outputted from the first DA converter of the bias circuit 21.

Accordingly, in a case that, or when, the required output power (power mode) is switched, the second bias current is supplied corresponding to the power mode before the first bias current is supplied, thus it is possible to suppress an overshoot of output power and excessive supply of the bias current which occur during the above switching.

Note that at the time t2 (second timing), it is desirable to output the first digital control signal to the register 31 and output, to the register 33, the second digital control signal for stopping the supply of the second bias current.

Accordingly, since the second bias current is stopped when the first bias current is outputted, power consumption can be reduced.

Further, the second bias current value outputted at the time t1 is desirably smaller than a first bias current value outputted at the time t2.

Accordingly, since the second bias current smaller than the first bias current is supplied before the first bias current is supplied during the switching of the required output power (power mode), it is possible to finely adjust the bias currents supplied to the power amplifiers 11 and 12 during the switching of the power mode.

Figure 4A:
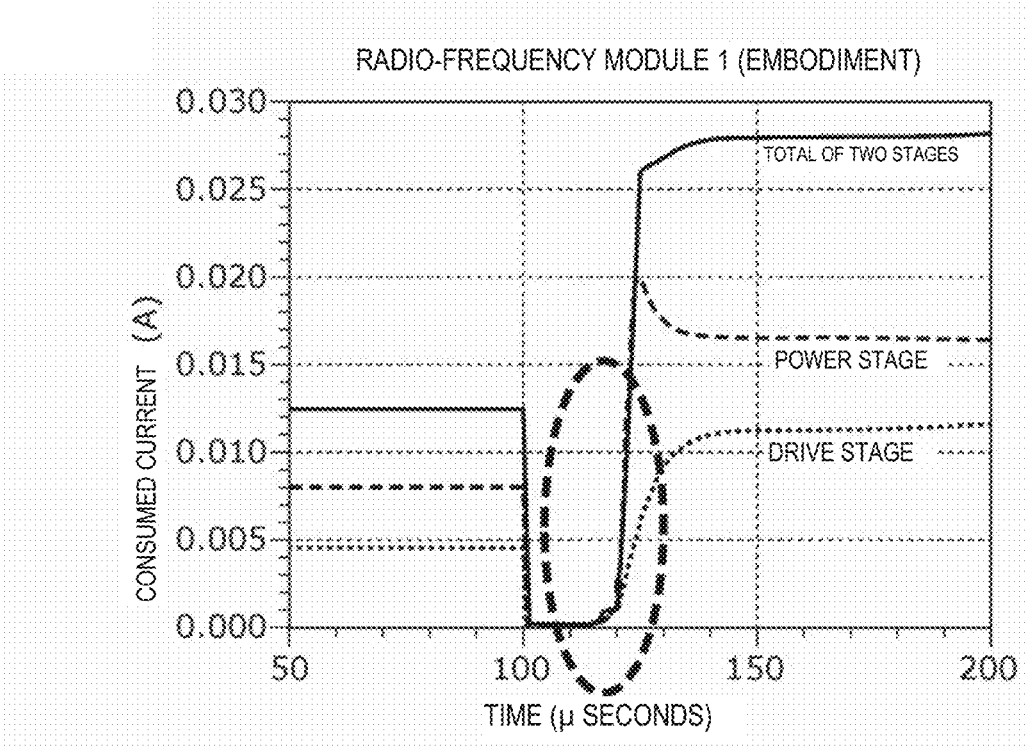
FIG. 4A is a graph illustrating time response characteristics of a consumed current in a case that, or when, a power mode of the radio-frequency module according to the embodiment changes (when power increases)

FIG. 4A is a graph illustrating time response characteristics of a consumed current in a case that, or when, the power mode of the radio-frequency module 1 according to the embodiment changes (when power increases). Further, FIG. 4B is a graph illustrating time response characteristics of a consumed current in a case that, or when, the power mode of the radio-frequency module 500 according to the comparative example changes (when power increases).

Figure 4B:
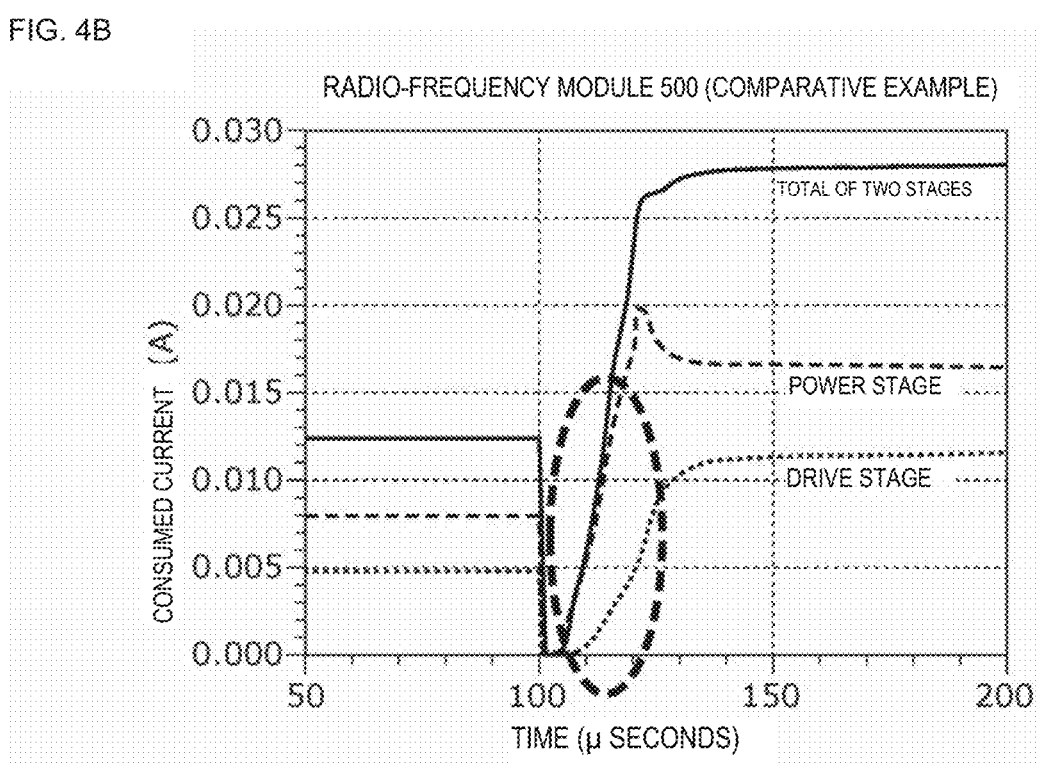
FIG. 4B is a graph illustrating time response characteristics of a consumed current in a case that, or when, a power mode of a radio-frequency module according to the comparative example changes (when power increases)

In the radio-frequency module 500 according to the comparative example, since currents are steadily supplied from the pre-charge circuit 543, unnecessary consumed currents are generated from the power amplifiers 11 and 12 in a transition period (a broken-line circle portion in FIG. 4B) of switching of the required output power (power mode) as shown in FIG. 4B. In addition, an overshoot (spike) of the consumed current during rising of the power amplifiers 11 and 12 becomes remarkable. In particular, in a high-speed and large-capacity communication system such as a 5G system, since a period during which an overshoot (spike) occurs during rising is also a time required for communication, there arises a problem that a communication failure occurs during the period. That is, in the radio-frequency module 500 according to the comparative example, consumed current characteristics of the power amplifiers 11 and 12 do not accurately correspond to a change in a required output power value, which leads to unstable output power characteristics.

On the other hand, in the radio-frequency module 1 according to the exemplary embodiment, in a case that, or when, the required output power (power mode) is switched (when power increases), the second bias current corresponding to the power mode change is supplied as a current for adjusting the first bias current before the first bias current is increased. Thus, as shown in FIG. 4A, there is a period in which no unnecessary consumed current is generated from the power amplifiers 11 and 12 in a transition period (a broken-line circle portion in FIG. 4A) of switching of the required output power (power mode), and thereafter the consumed current rapidly rises. In addition, it is possible to suppress an overshoot (spike) of the consumed current during rising of the power amplifiers 11 and 12. That is, consumed current characteristics of the power amplifiers 11 and 12 can correspond to a change in a required output power value with high accuracy, which leads to stable output characteristics. In other words, by suppressing a rapid change in the bias current in a case that, or when, the power mode is changed, it is possible to suppress an unnecessary response that does not satisfy the required output power from the power amplifier and to reduce a communication failure in a case that, or when, the power mode of the communication device 4 is switched.

Additionally, according to the above configuration of the radio-frequency module 1, both the cascade-connected power amplifiers 11 and 12 can use the bias circuit 23, and for example, the second bias current can be used as a current for adjusting the first bias current and the third bias current. Thus, it is possible to provide the radio-frequency module 1 which is small and in which output characteristics of the power amplifiers 11 and 12 are stable.

1.5 Circuit Configuration of Radio-Frequency Module 1A According to Exemplary Modification 1

Next, a circuit configuration of a radio-frequency module 1A according to exemplary Modification 1 will be described.

Figure 5:
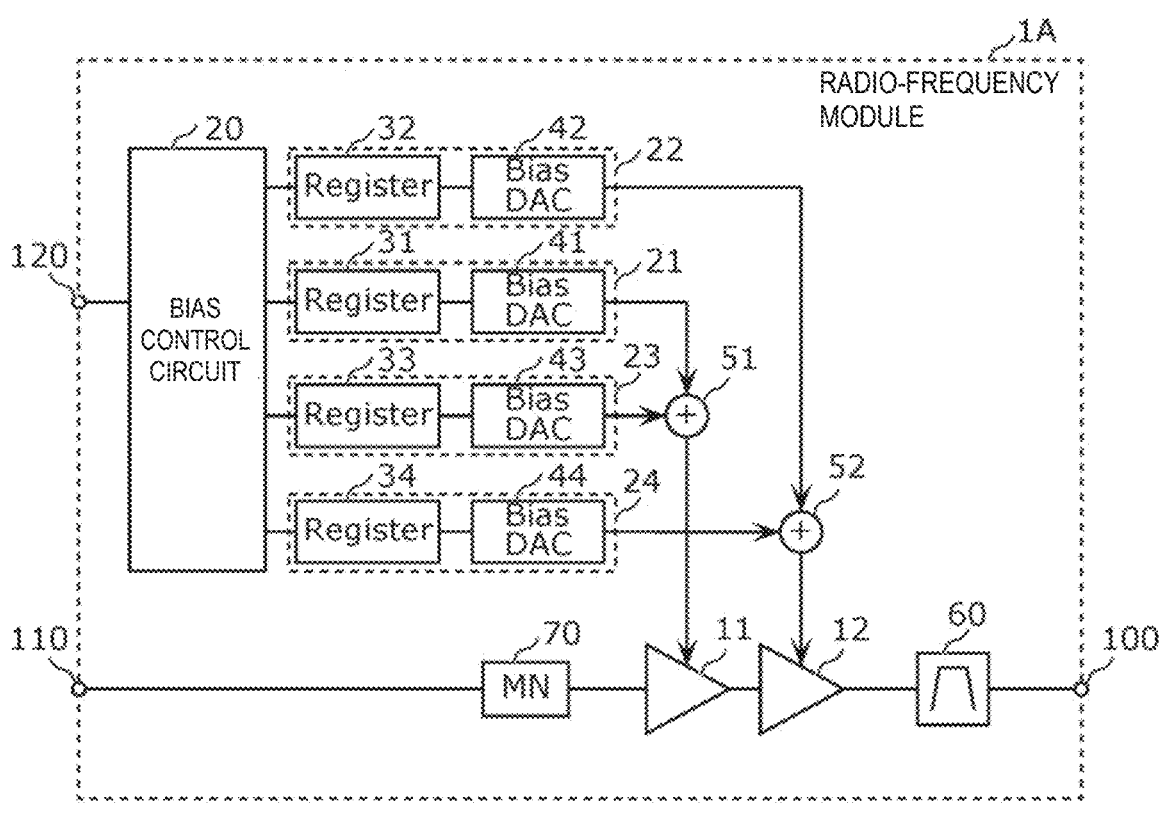
FIG. 5 is a circuit configuration diagram of a radio-frequency module according to exemplary Modification 1.

FIG. 5 is a circuit configuration diagram of the radio-frequency module 1A according to exemplary Modification 1. As illustrated in the figure, the radio-frequency module 1A according to exemplary Modification 1 is provided with the power amplifiers 11 and 12, the bias control circuit 20, the bias circuits 21, 22 and 23 and a bias circuit 24, the adders 51 and 52, the filter 60, the matching circuit 70, the antenna connection terminal 100, the signal input terminal 110 and the control signal terminal 120. The radio-frequency module 1A according to the exemplary modification is different from the radio-frequency module 1 according to the exemplary embodiment in that the bias circuit 24 is added. Hereinafter, with respect to the radio-frequency module 1A according to the exemplary modification, a description of the same configuration as that of the radio-frequency module 1 according to the exemplary embodiment will be omitted, and a description will be given focusing on a different configuration.

The bias circuit 21 is an example of the first bias circuit and is connected to the power amplifier 11. The bias circuit 21 has the register 31 and the current generation circuit 41.

The bias circuit 22 is an example of the third bias circuit and is connected to the power amplifier 12. The bias circuit 22 has the register 32 and the current generation circuit 42.

The bias circuit 23 is an example of the second bias circuit and is connected to the power amplifier 11. The bias circuit 23 has the register 33 and the current generation circuit 43.

The bias circuit 24 is an example of a fourth bias circuit and is connected to the power amplifier 12. The bias circuit 24 has a register 34 and a current generation circuit 44. The register 34 is an example of a fourth register and receives the fourth digital control signal corresponding to the power mode of the power amplifier 12 from the bias control circuit 20. The current generation circuit 44 is an example of a fourth current generation circuit and is configured to generate, based on information in the register 34, a fourth bias current. To be specific, the current generation circuit 44 has a fourth DA converter and a fourth current source circuit. The fourth DA converter converts a digital signal indicating magnitude of the fourth bias current stored in the register 34 into an analog signal, and the fourth current source circuit generates, based on the analog signal converted by the fourth DA converter, the fourth bias current.

The adder 51 combines (adds) the first bias current outputted from the bias circuit 21 with the second bias current outputted from the bias circuit 23. The adder 52 combines (adds) the third bias current outputted from the bias circuit 22 with the fourth bias current outputted from the bias circuit 24.

The bias control circuit 20 is an example of the control circuit and is connected between the control signal terminal 120 and the bias circuits 21, 22, 23 and 24. The bias control circuit 20 is configured to receive, from the RFIC 3, a control signal corresponding to the required output power (power mode) that the power amplifiers 11 and 12 are to output, and based on the control signal, supply the first digital control signal to the register 31, supply the second digital control signal to the register 33, supply the third digital control signal to the register 32 and supply the fourth digital control signal to the register 34. As each of the first digital control signal to the fourth digital control signal, for example, a control signal according to a source synchronization method for transmitting a data signal and a clock signal can be used, but the present disclosure is not limited thereto. For example, a clock embedded method may be applied to the first digital control signal to the fourth digital control signal.

According to the above configuration of the radio-frequency module 1A, each of the power amplifiers 11 and 12 can receive two bias currents corresponding to the power modes. Since the above two bias currents are individually generated based on information in different registers, for example, by using the second bias current as a current for adjusting the first bias current, it is possible to stabilize output characteristics of the power amplifier 11 compared with a case where one type of bias current is supplied to the power amplifier 11. In addition, for example, by using the fourth bias current as a current for adjusting the third bias current, it is possible to stabilize output characteristics of the power amplifier 12 compared with a case where one type of bias current is supplied to the power amplifier 12. Further, since a current for adjusting the bias current can be individually supplied to each of the power amplifiers 11 and 12, the bias current can be controlled with high accuracy.

1.6 Circuit Configuration of Radio-Frequency Module 1B According to Exemplary Modification 2

Next, a circuit configuration of a radio-frequency module 1B according to exemplary Modification 2 will be described.

Figure 6:
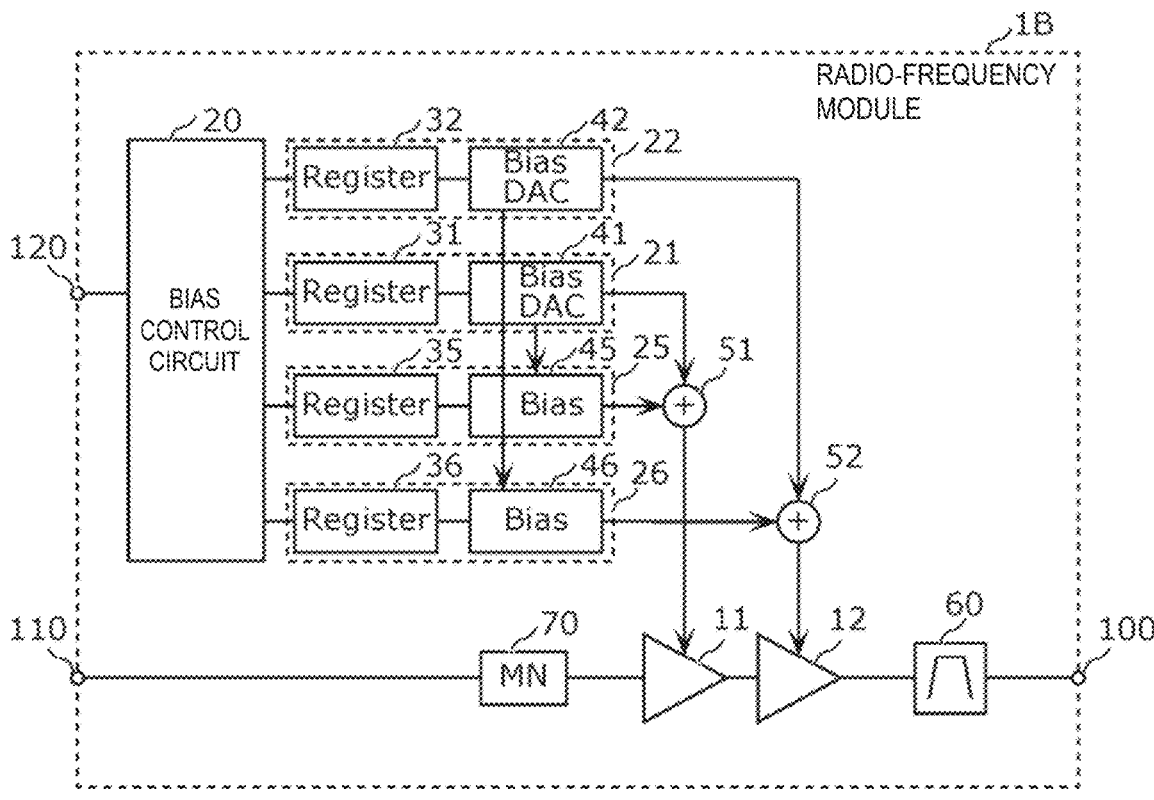
FIG. 6 is a circuit configuration diagram of a radio-frequency module according to exemplary Modification 2.

FIG. 6 is a circuit configuration diagram of the radio-frequency module 1B according to exemplary Modification 2. As illustrated in the figure, the radio-frequency module 1B according to exemplary Modification 2 is provided with the power amplifiers 11 and 12, the bias control circuit 20, the bias circuits 21 and 22, bias circuits 25 and 26, the adders 51 and 52, the filter 60, the matching circuit 70, the antenna connection terminal 100, the signal input terminal 110 and the control signal terminal 120. The radio-frequency module 1B according to the exemplary modification is different from the radio-frequency module 1A according to exemplary Modification 1 in that the bias circuits 25 and 26 are added instead of the bias circuits 23 and 24. Hereinafter, with respect to the radio-frequency module 1B according to the exemplary modification, a description of the same configuration as that of the radio-frequency module 1A according to exemplary Modification 1 will be omitted, and a description will be given focusing on a different configuration.

The bias circuit 25 is an example of the second bias circuit and is connected to the power amplifier 11. The bias circuit 25 has a register 35 and a current generation circuit 45. The register 35 is an example of the second register and receives the second digital control signal corresponding to the power mode of the power amplifier 11 from the bias control circuit 20. The current generation circuit 45 is an example of the second current generation circuit and is configured to generate, based on information in the register 35, the second bias current. The current generation circuit 45 has the second current source circuit. The current generation circuit 45 does not have a second DA converter, and the first DA converter of the bias circuit 21 converts a digital signal indicating magnitude of the second bias current stored in the register 35 into an analog signal. The second current source circuit is connected to the first DA converter and generates, based on the analog signal converted by the first DA converter, the second bias current.

The bias circuit 26 is an example of the fourth bias circuit and is connected to the power amplifier 12. The bias circuit 26 has a register 36 and a current generation circuit 46. The register 36 is an example of the fourth register and receives the fourth digital control signal corresponding to the power mode of the power amplifier 12 from the bias control circuit 20. The current generation circuit 46 is an example of the fourth current generation circuit and is configured to generate, based on information in the register 36, the fourth bias current. The current generation circuit 46 includes the fourth current source circuit. The current generation circuit 46 does not have a fourth DA converter, and a third DA converter of the bias circuit 22 converts a digital signal indicating magnitude of the fourth bias current stored in the register 36 into an analog signal. The fourth current source circuit is connected to the third DA converter and generates, based on the analog signal converted by the third DA converter, the fourth bias current.

The bias control circuit 20 is an example of the control circuit and is connected between the control signal terminal 120 and the bias circuits 21, 22, 25 and 26. The bias control circuit 20 is configured to receive, from the RFIC 3, a control signal corresponding to the required output power that the power amplifiers 11 and 12 are to output, and based on the control signal, supply the first digital control signal to the register 31, supply the second digital control signal to the register 35, supply the third digital control signal to the register 32 and supply the fourth digital control signal to the register 36. As each of the first digital control signal to the fourth digital control signal, for example, a control signal according to a source synchronization method for transmitting a data signal and a clock signal can be used, but the present disclosure is not limited thereto. For example, a clock embedded method may be applied to the first digital control signal to the fourth digital control signal.

According to the above configuration of the radio-frequency module 1B, each of the power amplifiers 11 and 12 can receive two bias currents corresponding to the power modes. Thus, the output characteristics of the power amplifiers 11 and 12 can be stabilized. Furthermore, since the first DA converter of the bias circuit 21 is used in a case that, or when, the second bias current is generated, and the third DA converter of the bias circuit 22 is used in a case that, or when, the fourth bias current is generated, the bias circuits 25 and 26 need not have a DA converter, and circuit scales of the bias circuits 25 and 26 can be reduced.

1.7 Circuit Configuration of Radio-Frequency Module 1C According to Exemplary Modification 3

Figure 7:
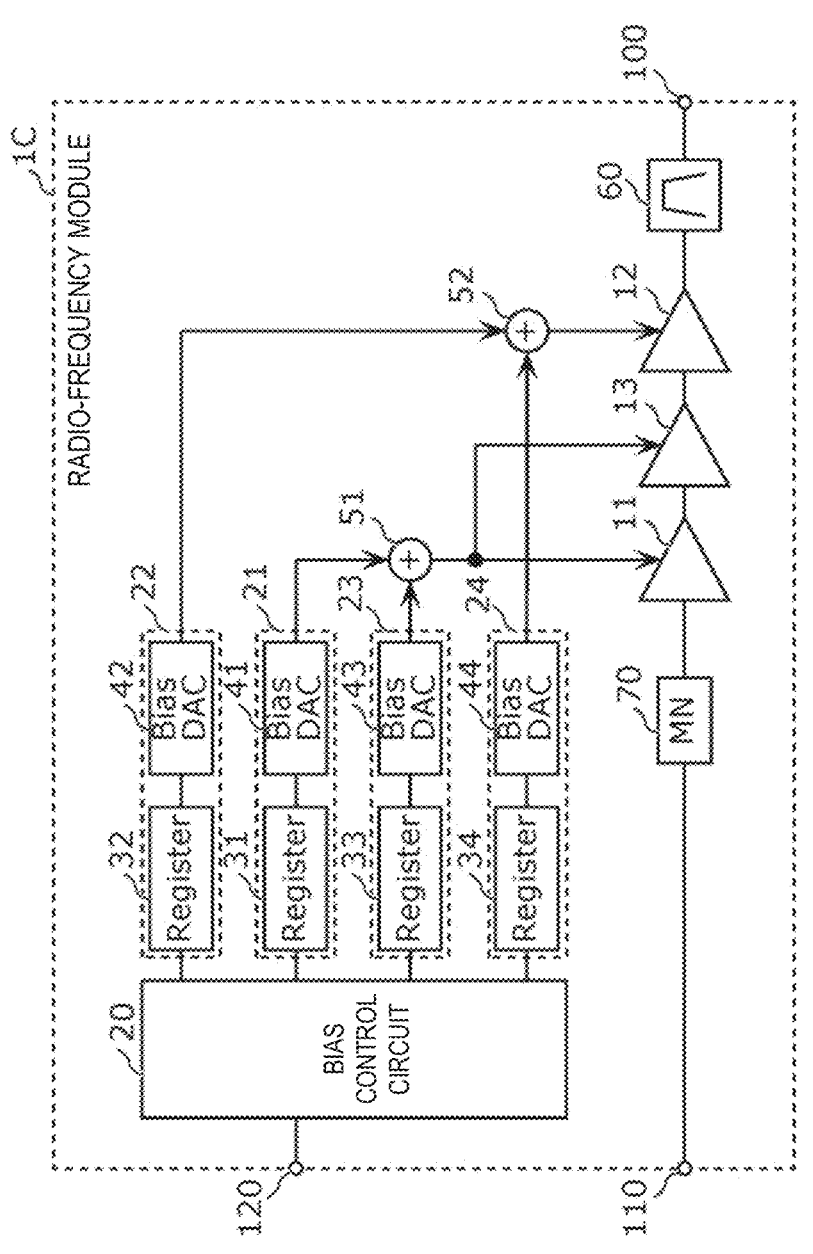
FIG. 7 is a circuit configuration diagram of a radio-frequency module according to exemplary Modification 3.

Next, a circuit configuration of a radio-frequency module 1C according to exemplary Modification 3 will be described. FIG. 7 is a circuit configuration diagram of the radio-frequency module 1C according to exemplary Modification 3. As illustrated in the figure, the radio-frequency module 1C according to exemplary Modification 3 is provided with the power amplifiers 11 and 12 and a power amplifier 13, the bias control circuit 20, the bias circuits 21, 22, 23 and 24, the adders 51 and 52, the filter 60, the matching circuit 70, the antenna connection terminal 100, the signal input terminal 110 and the control signal terminal 120. The radio-frequency module 1C according to the exemplary modification is different from the radio-frequency module 1A according to exemplary Modification 1 in that the power amplifier 13 is added and in a connection configuration of the bias circuits 21 to 24. Hereinafter, with respect to the radio-frequency module 1C according to the exemplary modification, a description of the same configuration as that of the radio-frequency module 1A according to exemplary Modification 1 will be omitted, and a description will be given focusing on a different configuration.

The power amplifier 11 is an example of the first power amplifier, is connected between the signal input terminal 110 and the antenna connection terminal 100 and is capable of amplifying a radio-frequency signal in the first band. The power amplifier 12 is an example of the second power amplifier, is connected between the signal input terminal 110 and the antenna connection terminal 100 and is capable of amplifying a radio-frequency signal in the first band. The power amplifier 13 is connected between the signal input terminal 110 and the antenna connection terminal 100 and is capable of amplifying a radio-frequency signal in the first band. The power amplifiers 11, 13 and 12 are cascade-connected to each other in this order from the signal input terminal 110.

The power amplifier 11 corresponds to the drive amplifier (pre-stage amplifier) of the radio-frequency module 1, and the power amplifier 12 corresponds to the power amplifier (post-stage amplifier) of the radio-frequency module 1.

The bias circuit 21 is an example of the first bias circuit and is connected to the power amplifiers 11 and 13. The bias circuit 21 has the register 31 and the current generation circuit 41.

The bias circuit 22 is an example of the third bias circuit and is connected to the power amplifier 12. The bias circuit 22 has the register 32 and the current generation circuit 42.

The bias circuit 23 is an example of the second bias circuit and is connected to the power amplifiers 11 and 13. The bias circuit 23 has the register 33 and the current generation circuit 43.

The bias circuit 24 is an example of the fourth bias circuit and is connected to the power amplifier 12. The bias circuit 24 has the register 34 and the current generation circuit 44.

The bias control circuit 20 is an example of the control circuit and is connected between the control signal terminal 120 and the bias circuits 21, 22, 23 and 24.

According to the above configuration of the radio-frequency module 1C, the power amplifiers 11 and 13 can receive the same two bias currents corresponding to the power modes from the bias circuits 21 and 23. Further, the power amplifier 12 can receive two bias currents corresponding to the power modes from the bias circuits 22 and 24. Thus, output characteristics of the power amplifiers 11, 12 and 13 can be stabilized. Furthermore, since the power amplifiers 11 and 13 receive the bias currents from the same bias circuits 21 and 23, circuit scales of the bias circuits can be reduced with respect to three power amplifiers.

Note that among the three power amplifiers 11 to 13, the combination for receiving a bias current from the same bias circuits need not be the above power amplifiers 11 and 13, and may be a combination of the power amplifiers 11 and 12 or a combination of the power amplifiers 12 and 13.

1.8 Circuit Configuration of Radio-Frequency Module 1D According to Exemplary Modification 4

Next, a circuit configuration of a radio-frequency module 1D according to exemplary Modification 4 will be described.

Figure 8:
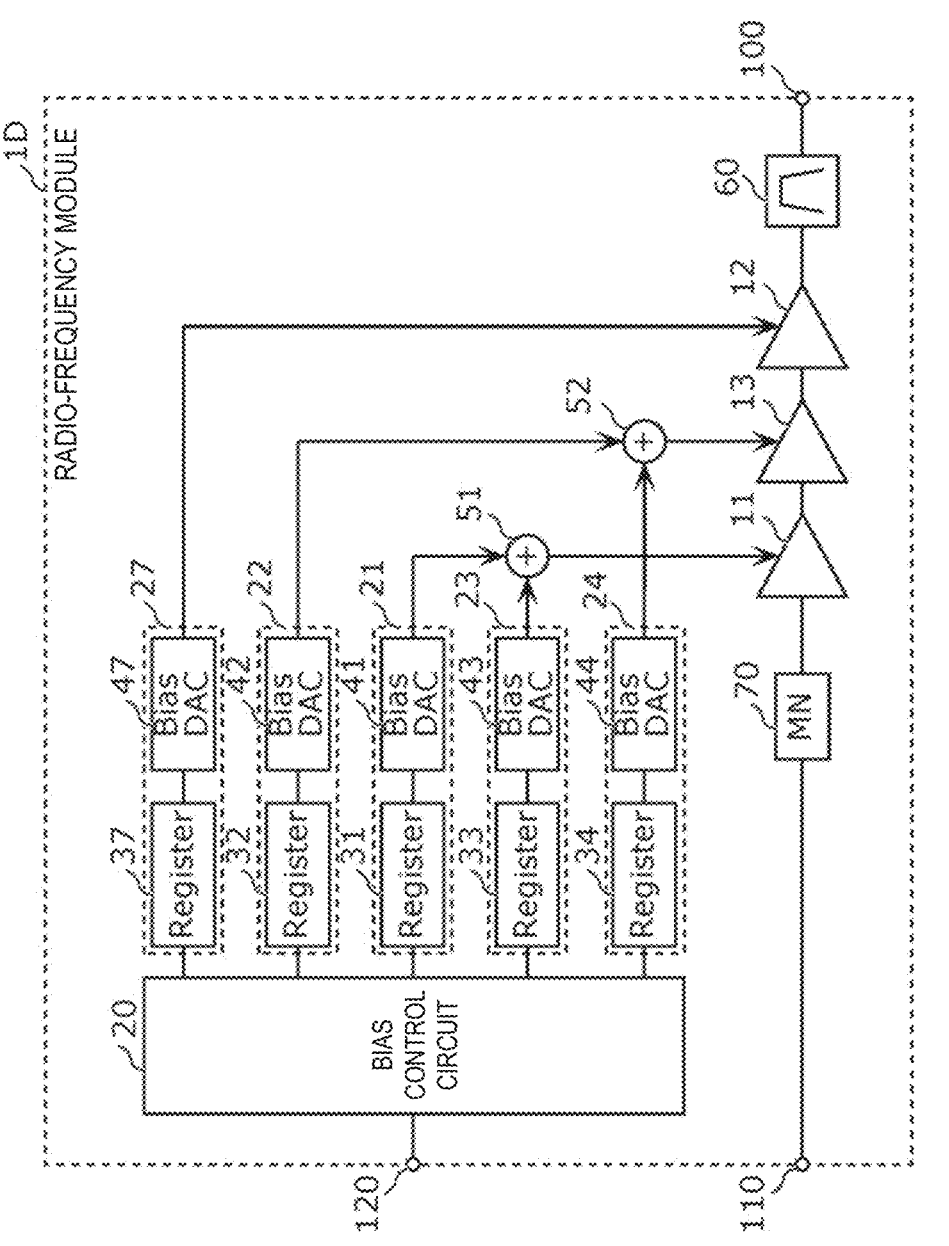
FIG. 8 is a circuit configuration diagram of a radio-frequency module according to exemplary Modification 4.

FIG. 8 is a circuit configuration diagram of the radio-frequency module 1D according to exemplary Modification 4. As illustrated in the figure, the radio-frequency module 1D according to exemplary Modification 4 is provided with the power amplifiers 11, 12 and 13, the bias control circuit 20, the bias circuits 21, 22, 23 and 24 and a bias circuit 27, the adders 51 and 52, the filter 60, the matching circuit 70, the antenna connection terminal 100, the signal input terminal 110 and the control signal terminal 120. The radio-frequency module 1D according to the exemplary modification is different from the radio-frequency module 1C according to exemplary Modification 3 in that the bias circuit 27 is added and in a connection configuration of the bias circuits 21 to 24. Hereinafter, with respect to the radio-frequency module 1D according to the exemplary modification, a description of the same configuration as that of the radio-frequency module 1C according to exemplary Modification 3 will be omitted, and a description will be given focusing on a different configuration.

The bias circuit 21 is an example of the first bias circuit and is connected to the power amplifier 11. The bias circuit 21 has the register 31 and the current generation circuit 41.

The bias circuit 22 is an example of the third bias circuit and is connected to the power amplifier 13. The bias circuit 22 has the register 32 and the current generation circuit 42.

The bias circuit 23 is an example of the second bias circuit and is connected to the power amplifier 11. The bias circuit 23 has the register 33 and the current generation circuit 43.

The bias circuit 24 is an example of the fourth bias circuit and is connected to the power amplifier 13. The bias circuit 24 has the register 34 and the current generation circuit 44.

The bias circuit 27 is connected to the power amplifier 12. The bias circuit 27 has a register 37 and a current generation circuit 47.

The bias control circuit 20 is an example of the control circuit and is connected between the control signal terminal 120 and the bias circuits 21, 22, 23, 24 and 27.

According to the above configuration of the radio-frequency module 1D, the power amplifier 11 can receive two bias currents corresponding to the power modes from the bias circuits 21 and 23. Further, the power amplifier 13 can receive two bias currents corresponding to the power modes from the bias circuits 22 and 24. On the other hand, the power amplifier 12 can receive one bias current corresponding to the power mode from the bias circuit 27. Thus, output characteristics of the power amplifiers 11 and 13 can be stabilized. Note that among the three power amplifiers 11 to 13, a power amplifier for receiving one bias current from one bias circuit need not be the power amplifier 12 described above, and may be the power amplifier 11 or 13.

1.9 Circuit Configuration of Radio-Frequency Module 1E According to Exemplary Modification 5

Next, a circuit configuration of a radio-frequency module 1E and a communication device 4E according to exemplary Modification 5 will be described.

Figure 9:
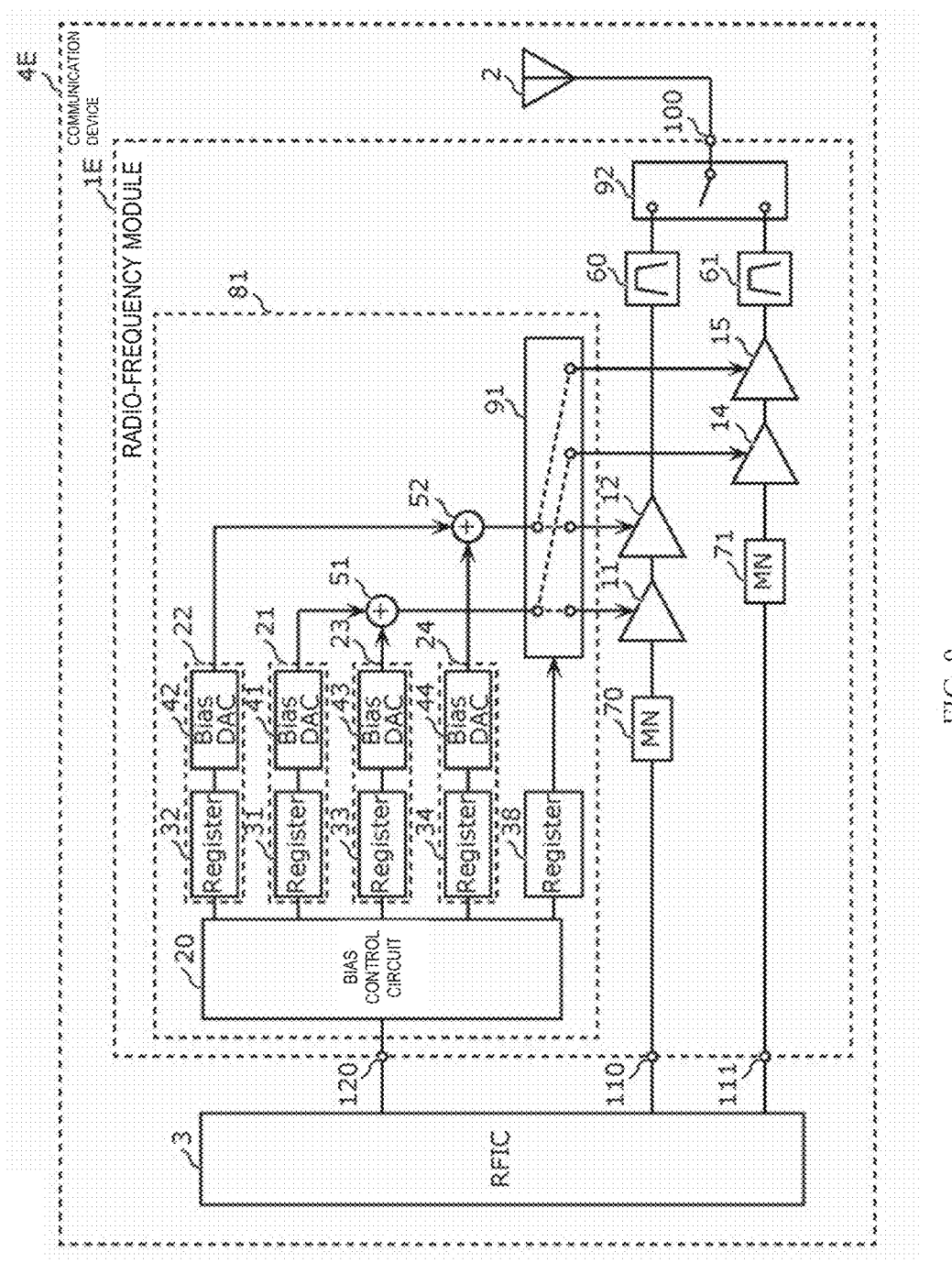
FIG. 9 is a circuit configuration diagram of a radio-frequency module and a communication device according to exemplary Modification 5.

FIG. 9 is a circuit configuration diagram of the radio-frequency module 1E and the communication device 4E according to exemplary Modification 5. As illustrated in the figure, the communication device 4E according to the exemplary modification is provided with the radio-frequency module 1E, the antenna 2 and the RFIC 3. The communication device 4E according to the exemplary modification is different from the communication device 4 according to the exemplary embodiment only in a configuration of the radio-frequency module 1E. Thus, the configuration of the radio-frequency module 1E according to the exemplary modification will be described below.

As illustrated in FIG. 9, the radio-frequency module 1E according to exemplary Modification 5 is provided with the power amplifiers 11 and 12 and power amplifiers 14 and 15, the bias control circuit 20, the bias circuits 21, 22, 23 and 24, a register 38, the adders 51 and 52, the filter 60 and a filter 61, the matching circuit 70, a matching circuit 71, switches 91 and 92, the antenna connection terminal 100, the signal input terminal 110 and a signal input terminal 111 and the control signal terminal 120. The radio-frequency module 1E according to the present modification is different from the radio-frequency module 1A according to exemplary Modification 1 in that the power amplifiers 14 and 15, the register 38, the switches 91 and 92, the filter 61 and the matching circuit 71 are added. Hereinafter, with respect to the radio-frequency module 1E according to the exemplary modification, a description of the same configuration as that of the radio-frequency module 1A according to exemplary Modification 1 will be omitted, and a description will be given focusing on a different configuration.

The power amplifier 11 is an example of the first power amplifier, is connected between the signal input terminal 110 and the antenna connection terminal 100 and is capable of amplifying a radio-frequency signal in the first band. The power amplifier 12 is an example of the second power amplifier, is connected between the signal input terminal 110 and the antenna connection terminal 100 and is capable of amplifying a radio-frequency signal in the first band. The power amplifier 12 is cascade-connected to the power amplifier 11.

The power amplifier 14 is an example of a third power amplifier, is connected between the signal input terminal 111 and the antenna connection terminal 100 and is capable of amplifying a radio-frequency signal in a second band. The power amplifier 15 is connected between the signal input terminal 111 and the antenna connection terminal 100 and is capable of amplifying a radio-frequency signal in the second band. The power amplifier 15 is cascade-connected to the power amplifier 14.

The bias circuit 21 is an example of the first bias circuit and is connected to the power amplifier 11 or 14 with the switch 91 interposed therebetween. The bias circuit 21 has the register 31 and the current generation circuit 41. The register 31 is an example of the first register and receives, from the bias control circuit 20, the first digital control signal corresponding to the power mode of the power amplifier 11 and a fifth digital control signal corresponding to the power mode of the power amplifier 14. The current generation circuit 41 is an example of the first current generation circuit and is configured to generate, based on information in the register 31, the first bias current. To be specific, the current generation circuit 41 has the first DA converter and the first current source circuit. The first DA converter converts digital information indicating magnitude of the first bias current stored in the register 31 into an analog signal, and the first current source circuit generates, based on the analog signal converted by the first DA converter, the first bias current.

The bias circuit 22 is an example of the third bias circuit and is connected to the power amplifier 12 or 15 with the switch 91 interposed therebetween. The bias circuit 22 has the register 32 and the current generation circuit 42. The register 32 is an example of the third register and receives, from the bias control circuit 20, the third digital control signal corresponding to the power mode of the power amplifier 12 and a seventh digital control signal corresponding to a power mode of the power amplifier 15. The current generation circuit 42 is an example of the third current generation circuit and is configured to generate, based on information in the register 32, the third bias current. To be specific, the current generation circuit 42 has the third DA converter and the third current source circuit. The third DA converter converts a digital signal indicating magnitude of the third bias current stored in the register 32 into an analog signal, and the third current source circuit generates, based on the analog signal converted by the third DA converter, the third bias current.

The bias circuit 23 is an example of the second bias circuit and is connected to the power amplifier 11 or 14 with the switch 91 interposed therebetween. The bias circuit 23 has the register 33 and the current generation circuit 43. The register 33 is an example of the second register and receives, from the bias control circuit 20, the second digital control signal corresponding to the power mode of the power amplifier 11 and a sixth digital control signal corresponding to the power mode of the power amplifier 14. The current generation circuit 43 is an example of the second current generation circuit and is configured to generate, based on information in the register 33, the second bias current. To be specific, the current generation circuit 43 has a second DA converter and a second current source circuit. The second DA converter converts a digital signal indicating magnitude of the second bias current stored in the register 33 into an analog signal, and the second current source circuit generates, based on the analog signal converted by the second DA converter, the second bias current.

The bias circuit 24 is an example of the fourth bias circuit and is connected to the power amplifier 12 or 15 with the switch 91 interposed therebetween. The bias circuit 24 has the register 34 and the current generation circuit 44. The register 34 is an example of the fourth register and receives, from the bias control circuit 20, the fourth digital control signal corresponding to the power mode of the power amplifier 12 and an eighth digital control signal corresponding to the power mode of the power amplifier 15. The current generation circuit 44 is an example of the fourth current generation circuit and is configured to generate, based on information in the register 34, the fourth bias current. To be specific, the current generation circuit 44 has the fourth DA converter and the fourth current source circuit. The fourth DA converter converts a digital signal indicating magnitude of the fourth bias current stored in the register 34 into an analog signal, and the fourth current source circuit generates, based on the analog signal converted by the fourth DA converter, the fourth bias current.

The register 38 is connected between the bias control circuit 20 and the switch 91 and receives, from the bias control circuit 20, a ninth digital control signal corresponding to a signal in a band to transmit out of the first band and the second band.

The adder 51 is connected between the bias circuits 21 and 23 and the switch 91 and combines (adds) the first bias current outputted from the bias circuit 21 with the second bias current outputted from the bias circuit 23. The adder 52 is connected between the bias circuits 22 and 24 and the switch 91 and combines (adds) the third bias current outputted from the bias circuit 22 with the fourth bias current outputted from the bias circuit 24.

The bias control circuit 20 is an example of the control circuit and is connected between the control signal terminal 120, and the bias circuits 21 to 24 and the register 38. The bias control circuit 20 is configured to receive, from the RFIC 3, a control signal corresponding to required output power that the power amplifiers 11, 12, 14 and 15 are to output, and based on the control signal, supply the first digital control signal and the fifth digital control signal to the register 31, supply the second digital control signal and the sixth digital control signal to the register 33, supply the third digital control signal and the seventh digital control signal to the register 32 and supply the fourth digital control signal and the eighth digital control signal to the register 34. In addition, the bias control circuit 20 receives, from the RFIC 3, a control signal corresponding to a signal in a band that the radio-frequency module 1E is to transmit out of the first band and the second band, and based on the control signal, supplies the ninth digital control signal to the register 38.

The switch 91 is an example of a first switch, is connected between the bias circuits 21 to 24 and the power amplifiers 11, 12, 14 and 15 and switches between connection between the bias circuits 21 and 23 and the power amplifier 11 and connection between the bias circuits 21 and 23 and the power amplifier 14 according to the ninth digital control signal supplied from the register 38. Further, the switch 91 switches between connection between the bias circuits 22 and 24 and the power amplifier 12 and connection between the bias circuits 22 and 24 and the power amplifier 15 according to the ninth digital control signal.

The filter 61 is connected between the antenna connection terminal 100 and the power amplifier 15 and has a pass band including the second band. The matching circuit 71 is connected between the signal input terminal 111 and the power amplifier 14 and achieves impedance matching between the RFIC 3 and the power amplifier 14.

The switch 92 switches between connection between the antenna connection terminal 100 and the power amplifiers 11 and 12 and connection between the antenna connection terminal 100 and the power amplifiers 14 and 15.

According to the above configuration of the radio-frequency module 1E, the power amplifier 11 or 14 selected by the switch 91 can receive two bias currents corresponding to the power modes from the bias circuits 21 and 23. Further, the power amplifier 12 or 15 selected by the switch 91 can receive two bias currents corresponding to the power modes from the bias circuits 22 and 24. In other words, the first bias current and the second bias current can be selectively supplied to one of the power amplifiers 11 and 14, and the third bias current and the fourth bias current can be selectively supplied to one of the power amplifiers 12 and 15. Thus, output characteristics of the power amplifiers 11, 12, 14 and 15 can be stabilized.

Further, the bias circuits 21 to 24, the register 38, the switch 91 and the bias control circuit 20 are included in one semiconductor IC 81. Accordingly, the radio-frequency module 1E can be reduced in size.

Note that the semiconductor IC 81 may include the power amplifiers 11, 12, 14 and 15. Accordingly, the radio-frequency module 1E can be further reduced in size.

1.10 Circuit Configuration of Radio-Frequency Module 1F According to Exemplary Modification 6

Next, a circuit configuration of a radio-frequency module 1F according to exemplary Modification 6 will be described.

Figure 10:
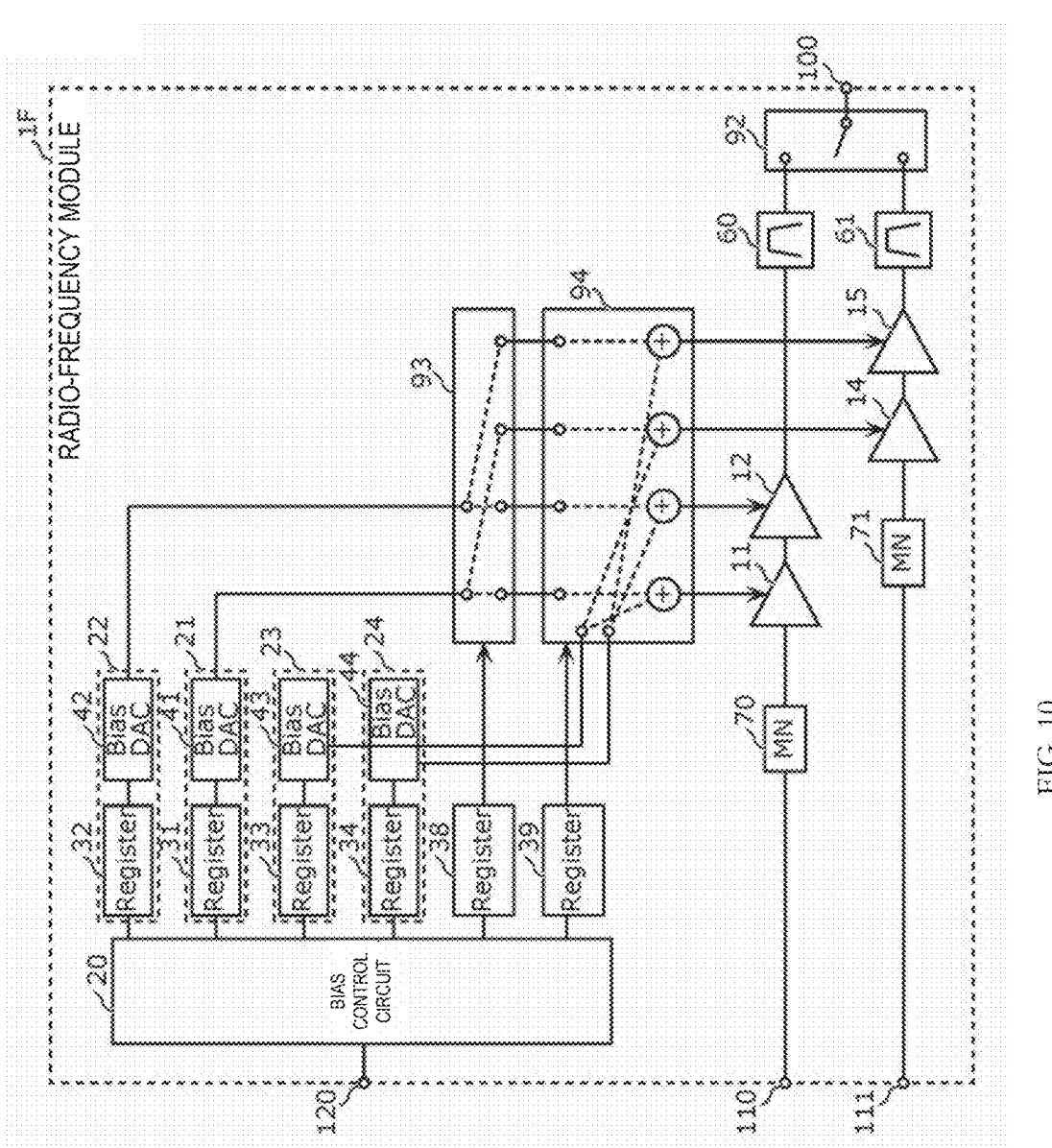
FIG. 10 is a circuit configuration diagram of a radio-frequency module according to exemplary Modification 6.

FIG. 10 is a circuit configuration diagram of the radio-frequency module 1F according to exemplary Modification 6. As illustrated in the figure, the radio-frequency module 1F is provided with the power amplifiers 11, 12, 14 and 15, the bias control circuit 20, the bias circuits 21, 22, 23 and 24, the register 38 and a register 39, the filters 60 and 61, the matching circuits 70 and 71, the switch 92, switches 93 and 94, the antenna connection terminal 100, the signal input terminals 110 and 111 and the control signal terminal 120. The radio-frequency module 1F according to the exemplary modification is different from the radio-frequency module 1E according to exemplary Modification 5 in that the switches 93 and 94 are added instead of the switch 91. Hereinafter, with respect to the radio-frequency module 1F according to the exemplary modification, a description of the same configuration as that of the radio-frequency module 1E according to exemplary Modification 5 will be omitted, and a description will be given focusing on a different configuration.

The bias circuit 21 is an example of the first bias circuit and is connected to the power amplifier 11 or 14 with the switches 93 and 94 interposed therebetween. The bias circuit 21 has the register 31 and the current generation circuit 41.

The bias circuit 22 is an example of the third bias circuit and is connected to the power amplifier 12 or 15 with the switches 93 and 94 interposed therebetween. The bias circuit 22 has the register 32 and the current generation circuit 42.

The bias circuit 23 is an example of the second bias circuit and is connected to the power amplifier 11 or 14 with the switch 94 interposed therebetween. The bias circuit 23 has the register 33 and the current generation circuit 43.

The bias circuit 24 is an example of the fourth bias circuit and is connected to the power amplifier 12 or 15 with the switch 94 interposed therebetween. The bias circuit 24 has the register 34 and the current generation circuit 44.

The register 38 is connected between the bias control circuit 20 and the switch 93 and receives, from the bias control circuit 20, the ninth digital control signal corresponding to a signal in a band to transmit out of the first band and the second band.

The register 39 is connected between the bias control circuit 20 and the switch 94 and receives, from the bias control circuit 20, a tenth digital control signal corresponding to a signal in a band to transmit out of the first band and the second band.

The bias control circuit 20 is an example of the control circuit and is connected between the control signal terminal 120, and the bias circuits 21 to 24 and the registers 38 and 39. The bias control circuit 20 is configured to receive, from the RFIC 3, a control signal corresponding to the required output power that the power amplifiers 11, 12, 14 and 15 are to output, and based on the control signal, supply the first digital control signal and the fifth digital control signal to the register 31, supply the second digital control signal and the sixth digital control signal to the register 33, supply the third digital control signal and the seventh digital control signal to the register 32 and supply the fourth digital control signal and the eighth digital control signal to the register 34. In addition, the bias control circuit 20 receives, from the RFIC 3, a control signal corresponding to a signal in a band that the radio-frequency module 1F is to transmit out of the first band and the second band, and based on the control signal, supplies the ninth digital control signal to the register 38 and supplies the tenth digital control signal to the register 39.

The switch 93 is an example of the first switch, is connected between the bias circuits 21 and 22 and the power amplifiers 11, 12, 14 and 15 and switches between connection between the bias circuit 21 and the power amplifier 11 and connection between the bias circuit 21 and the power amplifier 14 according to the ninth digital control signal supplied from the register 38. Further, the switch 93 switches between connection between the bias circuit 22 and the power amplifier 12 and connection between the bias circuit 22 and the power amplifier 15 according to the ninth digital control signal.

The switch 94 is an example of a second switch, is connected between the bias circuits 23 and 24 and the power amplifiers 11, 12, 14 and 15 and switches between connection between the bias circuit 23 and the power amplifier 11 and connection between the bias circuit 23 and the power amplifier 14 according to the tenth digital control signal supplied from the register 39. Further, the switch 94 switches between connection between the bias circuit 24 and the power amplifier 12 and connection between the bias circuit 24 and the power amplifier 15 according to the tenth digital control signal.

According to the above-described configuration of the radio-frequency module 1F, the power amplifier 11 or 14 selected by the switch 94 can receive a bias current corresponding to the power mode from the bias circuit 23. Further, the power amplifier 12 or 15 selected by the switch 94 can receive a bias current corresponding to the power mode from the bias circuit 24. In other words, the second bias current can be selectively supplied to one of the power amplifiers 11 and 14, and the fourth bias current can be selectively supplied to one of the power amplifiers 12 and

15. Thus, the output characteristics of the power amplifiers 11, 12, 14 and 15 can be stabilized.

1.11 Circuit Configuration of Radio-Frequency Module 1G According to Exemplary Modification 7

Next, a circuit configuration of a radio-frequency module 1G according to exemplary Modification 7 will be described.

Figure 11:
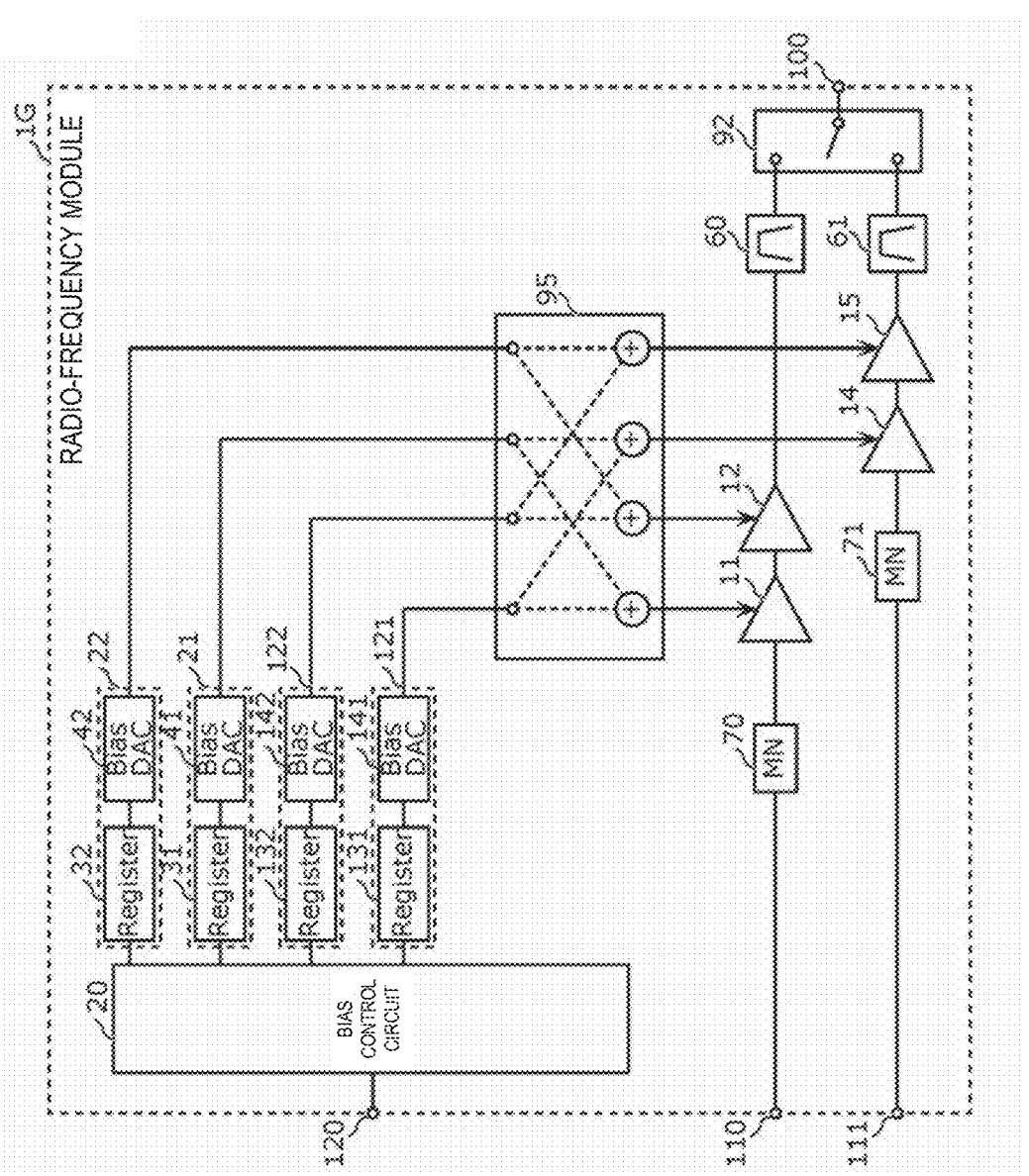
FIG. 11 is a circuit configuration diagram of a radio-frequency module according to exemplary Modification 7.

FIG. 11 is a circuit configuration diagram of the radio-frequency module 1G according to exemplary Modification 7. As illustrated in the figure, the radio-frequency module 1G is provided with the power amplifiers 11, 12, 14 and 15, the bias control circuit 20, the bias circuits 21 and 22 and bias circuits 121 and 122, the filters 60 and 61, the matching circuits 70 and 71, the switch 92 and a switch 95, the antenna connection terminal 100, the signal input terminals 110 and 111 and the control signal terminal 120. The radio-frequency module 1G according to the exemplary modification is different from the radio-frequency module 1E according to exemplary Modification 5 in that the switch 95 is added instead of the switch 91. Hereinafter, with respect to the radio-frequency module 1G according to the present modification, a description of the same configuration as that of the radio-frequency module 1E according to exemplary Modification 5 will be omitted, and a description will be given focusing on a different configuration.

The bias circuit 21 is an example of the first bias circuit and is connected to the power amplifier 11 or 14 with the switch 95 interposed therebetween. The bias circuit 21 has the register 31 and the current generation circuit 41.

The bias circuit 22 is an example of the third bias circuit and is connected to the power amplifier 12 or 15 with the switch 95 interposed therebetween. The bias circuit 22 has the register 32 and the current generation circuit 42.

The bias circuit 121 is an example of the second bias circuit and is connected to the power amplifier 11 or 14 with the switch 95 interposed therebetween. The bias circuit 121 has a register 131 and a current generation circuit 141. The register 131 is an example of the second register and receives, from the bias control circuit 20, the second digital control signal corresponding to the power mode of the power amplifier 11 and the sixth digital control signal corresponding to the power mode of the power amplifier 14. The current generation circuit 141 is an example of the second current generation circuit and is configured to generate, based on information in the register 131, the second bias current. To be specific, the current generation circuit 141 has the second DA converter and the second current source circuit. The second DA converter converts a digital signal indicating magnitude of the second bias current stored in the register 131 into an analog signal, and the second current source circuit generates, based on the analog signal converted by the second DA converter, the second bias current.

The bias circuit 122 is an example of the fourth bias circuit and is connected to the power amplifier 12 or 15 with the switch 95 interposed therebetween. The bias circuit 122 has a register 132 and a current generation circuit 142. The register 132 is an example of the fourth register and receives, from the bias control circuit 20, the fourth digital control signal corresponding to the power mode of the power amplifier 12 and the eighth digital control signal corresponding to the power mode of the power amplifier 15. The current generation circuit 142 is an example of the fourth current generation circuit and is configured to generate, based on information in the register 132, the fourth bias current. To be specific, the current generation circuit 142 has the fourth DA converter and the fourth current source circuit. The fourth DA converter converts a digital signal indicating magnitude of the fourth bias current stored in the register 132 into an analog signal, and the fourth current source circuit generates, based on the analog signal converted by the fourth DA converter, the fourth bias current.

The bias control circuit 20 is an example of the control circuit and is connected between the control signal terminal 120 and the bias circuits 21, 22, 121 and 122. The bias control circuit 20 is configured to receive, from the RFIC 3, a control signal corresponding to the required output power that the power amplifiers 11, 12, 14 and 15 are to output, and based on the control signal, supply the first digital control signal and the fifth digital control signal to the register 31, supply the third digital control signal and the seventh digital control signal to the register 32, supply the second digital control signal and the sixth digital control signal to the register 131 and supply the fourth digital control signal and the eighth digital control signal to the register 132.

The switch 95 is an example of a third switch, is connected between the bias circuits 21, 22, 121 and 122 and the power amplifiers 11, 12, 14 and 15 and switches between connection between the bias circuit 21 and the power amplifier 11 and connection between the bias circuit 21 and the power amplifier 14. Further, the switch 95 switches between connection between the bias circuit 22 and the power amplifier 12 and connection between the bias circuit 22 and the power amplifier 15. Further, the switch 95 switches between connection between the bias circuit 121 and the power amplifier 11 and connection between the bias circuit 121 and the power amplifier 14. Further, the switch 95 switches between connection between the bias circuit 122 and the power amplifier 12 and connection between the bias circuit 122 and the power amplifier 15.

According to the above configuration, in a case that, or when, the radio-frequency module 1G transmits a signal in the first band, the switch 95 connects the bias circuits 21 and 121 to the power amplifier 11 and connects the bias circuits 22 and 122 to the power amplifier 12. Thus, in the power amplifier 11, the second bias current can be used as a current for adjusting the first bias current, and in the power amplifier 12, the fourth bias current can be used as a current for adjusting the third bias current. On the other hand, in a case that, or when, the radio-frequency module 1G transmits a signal in the second band, the switch 95 connects the bias circuits 21 and 121 to the power amplifier 14 and connects the bias circuits 22 and 122 to the power amplifier 15. Thus, in the power amplifier 14, the second bias current can be used as a current for adjusting the first bias current, and in the power amplifier 15, the fourth bias current can be used as a current for adjusting the third bias current. Thus, the output characteristics of the power amplifiers 11, 12, 14 and 15 can be stabilized.

1.12 Circuit Configuration of Radio-Frequency Module 1H According to Exemplary Modification 8

Next, a circuit configuration of a radio-frequency module 1H according to exemplary Modification 8 will be described.

Figure 12:
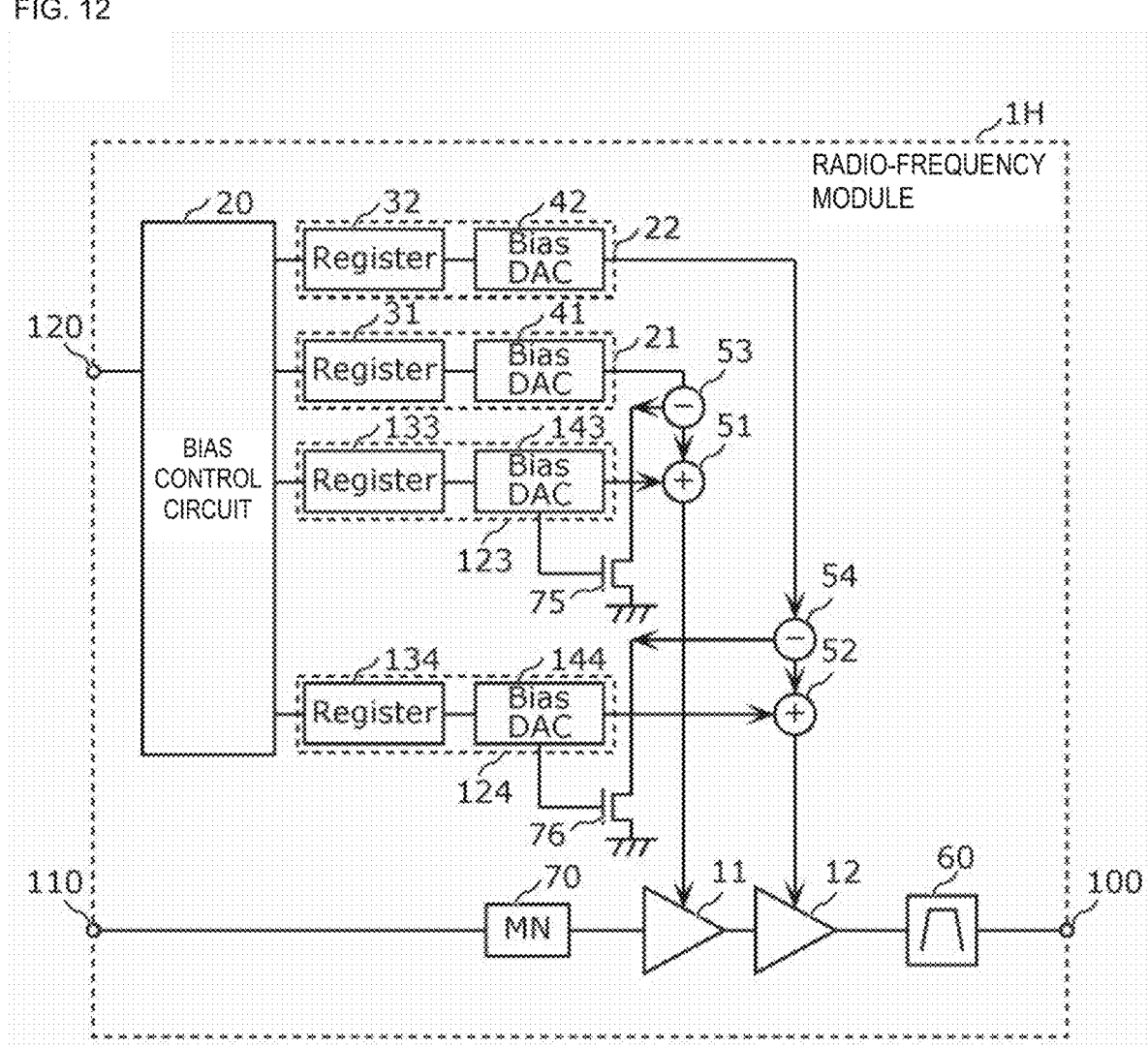
FIG. 12 is a circuit configuration diagram of a radio-frequency module according to exemplary Modification 8.

FIG. 12 is a circuit configuration diagram of the radio-frequency module 1H according to exemplary Modification 8. As illustrated in the figure, the radio-frequency module 1H is provided with the power amplifiers 11 and 12, the bias control circuit 20, the bias circuits 21 and 22 and bias circuits 123 and 124, the adders 51 and 52, subtracters 53 and 54, FETs 75 and 76, the filter 60, the matching circuit 70, the antenna connection terminal 100, the signal input terminal 110 and the control signal terminal 120. The radio-frequency module 1H according to the exemplary modification is different from the radio-frequency module 1A according to exemplary Modification 1 in that extraction circuits configured with the FETs 75 and 76 and the subtracters 53 and 54 are added. Hereinafter, with respect to the radio-frequency module 1H according to the exemplary modification, a description of the same configuration as that of the radio-frequency module 1A according to exemplary Modification 1 will be omitted, and a description will be given focusing on a different configuration.

The bias circuit 21 is an example of the first bias circuit and is connected to the power amplifier 11. The bias circuit 21 has the register 31 and the current generation circuit 41.

The bias circuit 22 is an example of the third bias circuit and is connected to the power amplifier 12. The bias circuit 22 has the register 32 and the current generation circuit 42.

The bias circuit 123 is an example of the second bias circuit and is connected to the power amplifier 11. The bias circuit 123 has a register 133 and a current generation circuit 143. The register 133 is an example of the second register and receives the second digital control signal corresponding to the power mode of the power amplifier 11 from the bias control circuit 20. The current generation circuit 143 is an example of the second current generation circuit and is configured to generate, based on information in the register 133, the second bias current. To be specific, the current generation circuit 143 has the second DA converter and the second current source circuit. The second DA converter converts a digital signal indicating magnitude of the second bias current stored in the register 133 into an analog signal, and the second current source circuit generates, based on the analog signal converted by the second DA converter, the second bias current.

The bias circuit 124 is an example of the fourth bias circuit and is connected to the power amplifier 12. The bias circuit 124 has a register 134 and a current generation circuit 144. The register 134 is an example of the fourth register and receives the fourth digital control signal corresponding to the power mode of the power amplifier 12 from the bias control circuit 20. The current generation circuit 144 is an example of the fourth current generation circuit and is configured to generate, based on information in the register 134, the fourth bias current. To be specific, the current generation circuit 144 has the fourth DA converter and the fourth current source circuit. The fourth DA converter converts a digital signal indicating magnitude of the fourth bias current stored in the register 134 into an analog signal, and the fourth current source circuit generates, based on the analog signal converted by the fourth DA converter, the fourth bias current.

The subtracter 53 is configured to extract a part of the first bias current outputted from the bias circuit 21 from a path connecting the bias circuit 21 and the power amplifier 11. The subtracter 54 is configured to extract a part of the third bias current outputted from the bias circuit 22 from a path connecting the bias circuit 22 and the power amplifier 12.

The FET (Field Effect Transistor) 75 is an example of a first transistor and has a gate terminal (first control terminal) connected to the bias circuit 123, a drain terminal (first terminal) connected to the subtracter 53 and a source terminal (second terminal) connected to a ground.

The FET 76 has a gate terminal connected to the bias circuit 124, a drain terminal connected to the subtracter 54 and a source terminal connected to the ground.

The FET 75 and the subtracter 53 constitute a first extraction circuit and are configured to extract a part of the first bias current outputted from the bias circuit 21 from the path connecting the bias circuit 21 and the power amplifier 11.

The bias control circuit 20 is an example of the control circuit and is connected between the control signal terminal 120 and the bias circuits 21, 22, 123 and 124. The bias control circuit 20 is configured to receive, from the RFIC 3, a control signal corresponding to the required output power that the power amplifiers 11 and 12 are to output, and based on the control signal, supply the first digital control signal to the register 31, supply the second digital control signal to the register 133, supply the third digital control signal to the register 32 and supply the fourth digital control signal to the register 134. As each of the first digital control signal to the fourth digital control signal, for example, a control signal according to a source synchronization method for transmitting a data signal and a clock signal can be used, but the present disclosure is not limited thereto. For example, a clock embedded method may be applied to the first digital control signal to the fourth digital control signal.

According to the above-described configuration of the radio-frequency module 1H, in a case that, or when, the power mode of the power amplifier 11 is switched from the high power (for example, 23 dBm) to the low power (for example, 10 dBm), based on the second digital control signal, such a gate voltage is applied from the bias circuit 123 to the gate terminal of the FET 75 that the FET 75 conducts electricity. This makes it possible to extract, in advance, a part of the first bias current supplied from the bias circuit 21. In other words, the second bias current which is negative can be used, based on the second digital control signal, as a current for adjusting the first bias current. Similarly, in a case that, or when, the power mode of the power amplifier 12 is switched from the high power (for example, 23 dBm) to the low power (for example, 10 dBm), based on the fourth digital control signal, such a gate voltage is applied from the bias circuit 124 to the gate terminal of the FET 76 that the FET 76 conducts electricity. This makes it possible to extract, in advance, a part of the third bias current supplied from the bias circuit 22. In other words, the fourth bias current which is negative can be used, based on the fourth digital control signal, as a current for adjusting the third bias current. Thus, since the first bias current can be reduced in advance, for example, a trailing time of output of the power amplifiers 11 and 12 can be shortened at a moment of a change from the high power mode to the low power mode.

Additionally, since the first extraction circuit has the FET 75, an amount of extraction of the first bias current from the above path can be adjusted by the gate voltage (control signal) applied to the FET 75 from the bias circuit 123.

Note that each of the subtracters 53 and 54 only needs to have a function of extracting (subtracting) a part of the bias current. From this point of view, in a case that, or when, the bias circuit 123 is connected to a third node on the path connecting the power amplifier 11 and the bias circuit 21, the third node corresponds to the subtracter 53. Further, in a case that, or when, the bias circuit 124 is connected to a fourth node on the path connecting the power amplifier 12 and the bias circuit 22, the fourth node corresponds to the subtracter 54.

1.13 Circuit Configuration of Radio-Frequency Module 1J According to Exemplary Modification 9

Next, a circuit configuration of a radio-frequency module 1J according to exemplary Modification 9 will be described.

Figure 13:
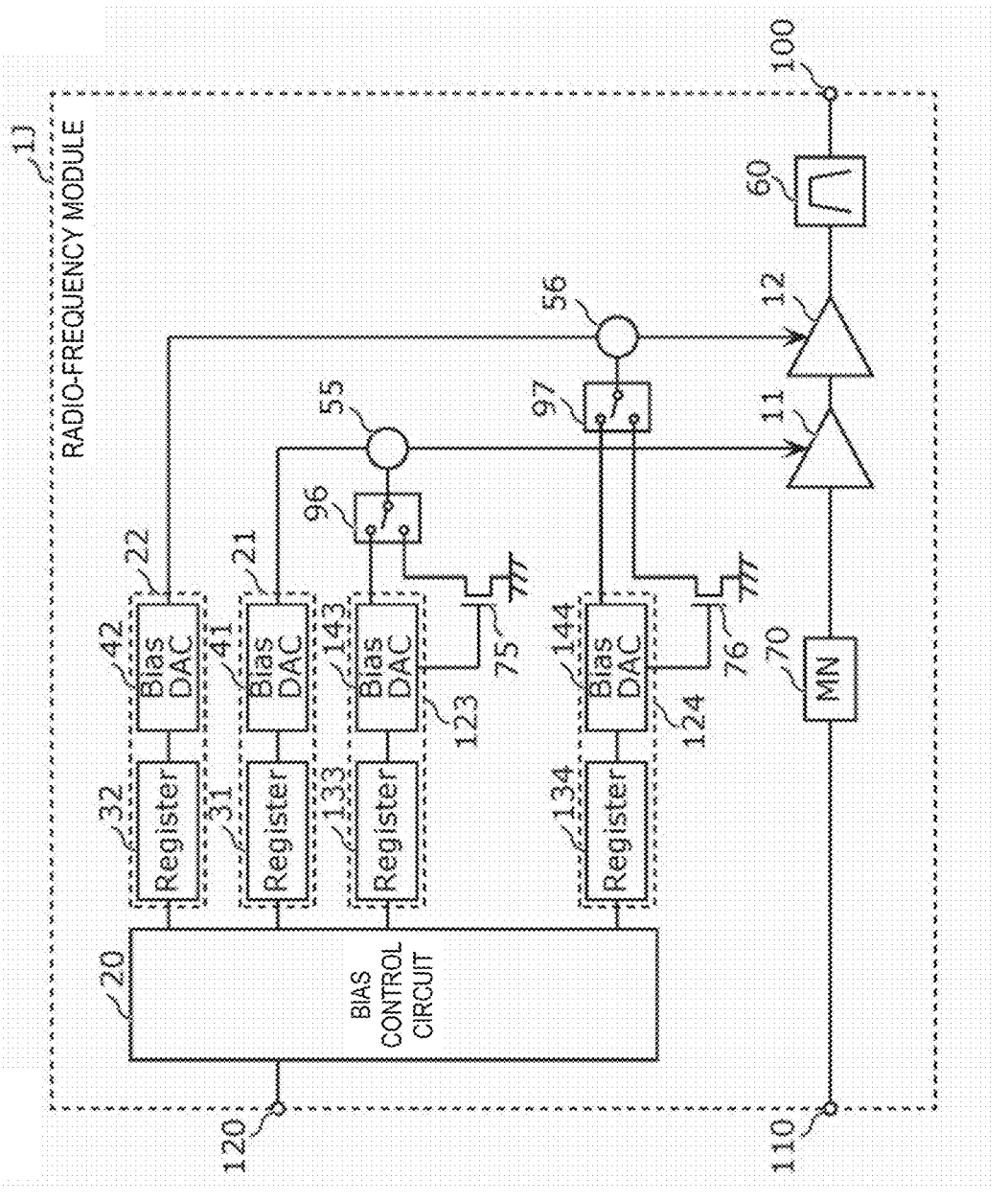
FIG. 13 is a circuit configuration diagram of a radio-frequency module according to exemplary Modification 9.

FIG. 13 is a circuit configuration diagram of the radio-frequency module 1J according to exemplary Modification 9. As illustrated in the figure, the radio-frequency module 1J is provided with the power amplifiers 11 and 12, the bias control circuit 20, the bias circuits 21, 22, 123 and 124, the FETs 75 and 76, switches 96 and 97, the filter 60, the matching circuit 70, the antenna connection terminal 100, the signal input terminal 110 and the control signal terminal 120. The radio-frequency module 1J according to the exemplary modification is different from the radio-frequency module 1H according to exemplary Modification 8 in that the switches 96 and 97 are added. Hereinafter, with respect to the radio-frequency module 1J according to the exemplary modification, a description of the same configuration as that of the radio-frequency module 1H according to exemplary Modification 8 will be omitted, and a description will be given focusing on a different configuration.

The switch 96 is an example of a fourth switch, is connected between a path connecting the bias circuit 21 and the power amplifier 11 and each of the FET 75 and the bias circuit 123, and switches connection between the FET 75 and the above path and connection between the bias circuit 123 and the above path. To be more specific, a common terminal of the switch 96 is connected to a node 55 on the above path, a first selection terminal of the switch 96 is connected to the bias circuit 123, and a second selection terminal of the switch 96 is connected to the FET 75.

The switch 97 is connected between a path connecting the bias circuit 22 and the power amplifier 12 and each of the FET 76 and the bias circuit 124, and switches between connection between the FET 76 and the above path and connection between the bias circuit 124 and the above path. To be more specific, a common terminal of the switch 97 is connected to a node 56 on the above path, a first selection terminal of the switch 97 is connected to the bias circuit 124, and a second selection terminal of the switch 97 is connected to the FET 76.

According to the above configuration, by switching the switch 96 in accordance with an instruction from the bias circuit 123, for example, the second bias current can be outputted from the bias circuit 123 as an adjustment current at a moment of a change from the low power mode to the high power mode, and a part of the first bias current can be extracted from the above path at a moment of a change from the high power mode to the low power mode.

Additionally, by switching the switch 97 in accordance with an instruction from the bias circuit 124, for example, the fourth bias current can be outputted from the bias circuit 124 as an adjustment current at a moment of a change from the low power mode to the high power mode, and a part of the third bias current can be extracted from the above path at a moment of a change from the high power mode to the low power mode.

Figure 14A:
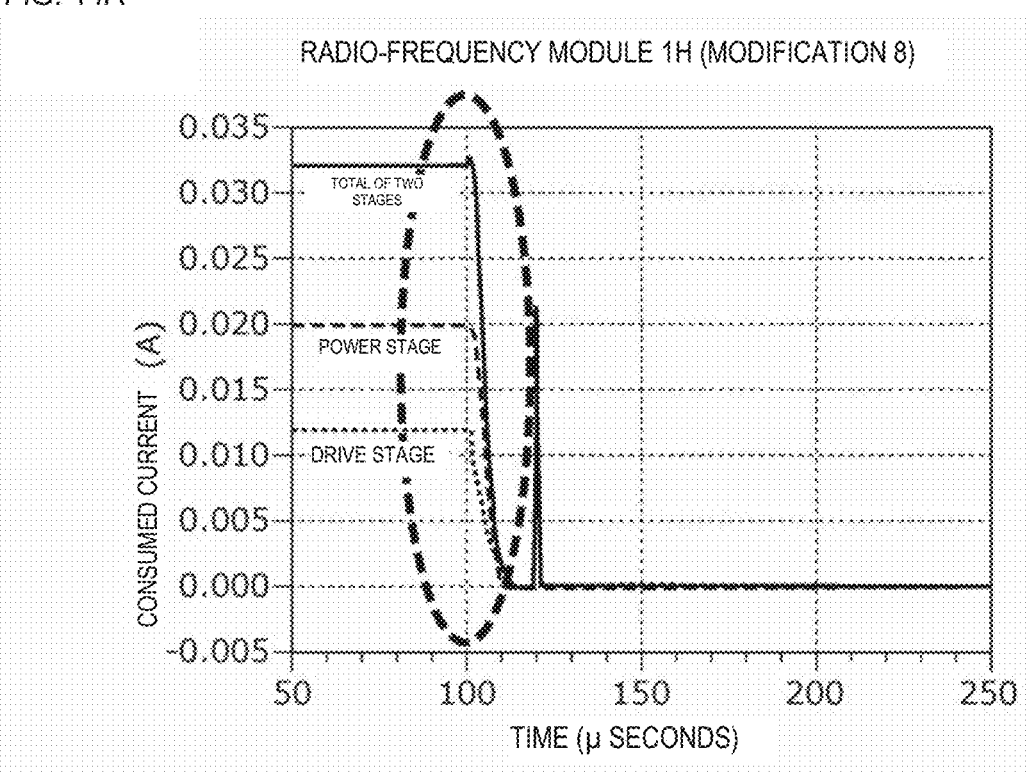
FIG. 14A is a graph illustrating time response characteristics of a consumed current in a case that, or when, a power mode of the radio-frequency modules according to exemplary Modification 8 and exemplary Modification 9 changes (when power decreases)

FIG. 14A is a graph illustrating time response characteristics of a consumed current in a case that, or when, a power mode of the radio-frequency module 1H according to exemplary Modification 8 (and the radio-frequency module 1J according to exemplary Modification 9) changes (when power decreases). Further, FIG. 14B is a graph illustrating time response characteristics of a consumed current in a case that, or when, a power mode of the radio-frequency module 500 according to the comparative example changes (when power decreases).

In the radio-frequency module 500 according to the comparative example, since currents are steadily supplied from the pre-charge circuit 543, unnecessary consumed currents are generated from the power amplifiers 11 and 12 in a transition period (a broken-line circle portion in FIG. 14B) of switching of the required output power (power mode) as shown in FIG. 14B. In addition, a spike waveform of the consumed current during trailing of the power amplifiers 11 and 12 becomes remarkable.

On the other hand, in the radio-frequency module 1H according to exemplary Modification 8 (and the radio-frequency module 1J according to exemplary Modification 9), in a case that, or when, the required output power (power mode) is switched (when power decreases), before the first bias current is reduced, a part of the first bias current is extracted as a current for adjusting the first bias current in accordance with the power mode change. Thus, as shown in FIG. 14A, there is a period in which no unnecessary consumed current is generated from the power amplifiers 11 and 12 in the transition period (a broken-line circle portion in FIG. 14A) of switching of the required output power (power mode), and thereafter a spike waveform during trailing of the consumed current is also suppressed. In other words, by suppressing a rapid change in the bias current in a case that, or when, the power mode is changed, it is possible to suppress an unnecessary response that does not satisfy the required output power from the power amplifier and to reduce a communication failure in a case that, or when, the power mode is switched.

2. Effects and the Like

As described above, the radio-frequency module 1 according to the exemplary embodiment is provided with the power amplifier 11, the bias circuit 21 connected to the power amplifier 11 and the bias circuit 23 connected to the power amplifier 11, in which the bias circuit 21 has the register 31 that receives the first digital control signal corresponding to the power mode of the power amplifier 11 and the current generation circuit 41 configured to generate, based on the information in the register 31, the first bias current, and the bias circuit 23 has the register 33 that receives the second digital control signal corresponding to the power mode and the current generation circuit 43 configured to generate, based on the information in the register 33, the second bias current.

Accordingly, the power amplifier 11 can receive the two bias currents (the first bias current and the second bias current) corresponding to the power modes. Since the above two bias currents are individually generated based on information in different registers, for example, by using the second bias current as a current for adjusting the first bias current, it is possible to stabilize the output power characteristics of the power amplifier 11 against a change in the required output power as compared with a case where one type of bias current is supplied to the power amplifier 11.

Further, for example, in the radio-frequency module 1, the bias circuit 23 may be connected to the path connecting the power amplifier 11 and the bias circuit 21.

Accordingly, since the first bias current and the second bias current are combined with each other at a node on the above path and supplied to the power amplifier 11, the number of bias supply terminals of the power amplifier 11 can be made one.

Further, for example, in the radio-frequency module 1, the current generation circuit 41 may have the first DA converter connected to the register 31 and the first current source circuit connected to the first DA converter, and the current generation circuit 43 may have the second DA converter connected to the register 33 and the second current source circuit connected to the second DA converter.

Accordingly, digital information indicating magnitude of a bias current stored in the register into an analog current value in each of the bias circuits 21 and 23.

Further, for example, in the radio-frequency module 1B according to exemplary Modification 2, the current generation circuit 41 may have the first DA converter connected to the register 31 and the register 35 and the first current source circuit connected to the first DA converter, and the current generation circuit 45 may have the second current source circuit connected to the first DA converter.

Accordingly, in a case that, or when, the second bias current is generated in the bias circuit 25, the first DA converter of the bias circuit 21 is used, thus the bias circuit 25 need not have a DA converter, and a circuit scale of the bias circuit 25 can be reduced.

Further, for example, the radio-frequency module 1 may further be provided with the bias control circuit 20 configured to supply the first digital control signal to the register 31 and supply the second digital control signal to the register 33.

Accordingly, in a case that, or when, one bias control circuit 20 controls both the bias circuits 21 and 23, both the bias circuits can be synchronized with each other in activation timing. That is, since magnitude and output timing of the second bias current can be made to correspond to the first bias current, output power from the power amplifier 11 can be stabilized.

Further, for example, in the radio-frequency module 1, the bias control circuit 20 may output the second digital control signal to the register 33 at the time t1 at which the power mode is switched to cause the second bias current to be outputted from the bias circuit 23, and may output the first digital control signal to the register 31 at the time t2 after elapse of a predetermined time from the time t1 to cause the first bias current to be outputted from the bias circuit 21.

Accordingly, in a case that, or when, the power mode is switched, the second bias current is supplied in accordance with the power mode before the first bias current is supplied, thus it is possible to suppress an overshoot (spike waveform) of output power and excessive supply of the bias current which occur during the above switching.

Further, for example, in the radio-frequency module 1, the second bias current outputted according to the second digital control signal may be smaller than the first bias current outputted according to the first digital control signal.

Accordingly, since the second bias current smaller than the first bias current is supplied before the first bias current is supplied during switching of the power mode, it is possible to finely adjust the bias current supplied to the power amplifier 11 during switching of the power mode.

Further, for example, in the radio-frequency module 1, the bias control circuit 20 may output the first digital control signal to the register 31 at the time t2 and may output, to the register 33, the second digital control signal for stopping supply of the second bias current.

Accordingly, since the second bias current is stopped when the first bias current is outputted, power consumption can be reduced.

Further, for example, the radio-frequency module 1 may further be provided with the power amplifier 12 cascade-connected to the power amplifier 11 and the bias circuit 22 connected to the power amplifier 12, the bias circuit 22 may have the register 32 that receives the third digital control signal corresponding to the power mode of the power amplifier 12 and the current generation circuit 42 configured to generate, based on information in the register 32, the third bias current, the bias circuit 23 may be connected to the power amplifiers 11 and 12, and the register 33 may receive the second digital control signal corresponding to the power mode of the power amplifier 11 and the fourth digital control signal corresponding to the power mode of the power amplifier 12.

Accordingly, both the cascade-connected power amplifiers 11 and 12 can use the bias circuit 23, and, for example, the second bias current can be used as a current for adjusting the first bias current and the third bias current. Thus, it is possible to provide the radio-frequency module 1 which is small and in which output power characteristics of the power amplifiers 11 and 12 are stable.

Further, for example, the radio-frequency module 1A according to exemplary Modification 1 may be provided with the cascade-connected power amplifiers 11 and 12, the bias circuits 21 and 23 connected to the power amplifier 11 and the bias circuits 22 and 24 connected to the power amplifier 12, the bias circuit 22 may have the register 32 that receives the third digital control signal corresponding to the power mode of the power amplifier 12 and the current generation circuit 42 configured to generate, based on information in the register 32, the third bias current, and the bias circuit 24 may have the register 34 that receives the fourth digital control signal corresponding to the power mode and the current generation circuit 44 configured to generate, based on information in the register 34, the fourth bias current.

Accordingly, each of the power amplifiers 11 and 12 can receive two bias currents corresponding to the power modes. Since the above two bias currents are individually generated based on information in different registers, for example, by using the second bias current as a current for adjusting the first bias current, it is possible to stabilize output power characteristics of the power amplifier 11 compared with a case where one type of bias current is supplied to the power amplifier 11. In addition, for example, by using the fourth bias current as a current for adjusting the third bias current, it is possible to stabilize output power characteristics of the power amplifier 12 compared with a case where one type of bias current is supplied to the power amplifier 12. Further, since the current for adjusting the bias current can be individually supplied to each power amplifier, the bias current can be controlled with high accuracy.

Further, for example, the radio-frequency module 1E according to Modification 5 may be provided with the power amplifiers 11 and 14 and the switch 91 that is connected between the bias circuit 21 and the power amplifiers 11 and 14 and switches between the connection between the bias circuits 21 and 23 and the power amplifier 11 and the connection between the bias circuits 21 and 23 and the power amplifier 14, the register 31 may receive the first digital control signal corresponding to the power mode of the power amplifier 11 and the fifth digital control signal corresponding to the power mode of the power amplifier 14, and the register 33 may receive the second digital control signal corresponding to the power mode of the power amplifier 11 and the sixth digital control signal corresponding to the power mode of the power amplifier 14.

Accordingly, the first bias current and the second bias current can be selectively supplied to one of the power amplifiers 11 and 14.

Further, for example, the radio-frequency module 1F according to Modification 6 may be provided with the power amplifiers 11 and 14, the bias circuit 21 that can be connected to the power amplifiers 11 and 14, the bias circuit 23 that can be connected to the power amplifiers 11 and 14 and the switch 94 that is connected between the bias circuit 23 and the power amplifiers 11 and 14 and switches between the connection between the bias circuit 23 and the power amplifier 11 and the connection between the bias circuit 23 and the power amplifier 14, the register 33 may receive the second digital control signal corresponding to the power mode of the power amplifier 11 and the sixth digital control signal corresponding to the power mode of the power amplifier 14.

Accordingly, the second bias current can be selectively supplied to one of the first power amplifier and the third power amplifier.

Accordingly, the power amplifier 11 or 14 selected by the switch 94 can receive the bias current corresponding to the power mode from the bias circuit 23. That is, the second bias current can be selectively supplied to one of the power amplifiers 11 and 14. Thus, output power characteristics of the power amplifiers 11 and 14 can be stabilized.

Further, for example, the radio-frequency module 1G according to exemplary Modification 7 may be provided with the power amplifiers 11 and 14, the bias circuits 21 and 121 and the switch 95 that is connected between the bias circuits 21 and 121 and the power amplifiers 11 and 14 and switches between connection between the bias circuits 21 and 121 and the power amplifier 11 and connection between the bias circuits 21 and 121 and the power amplifier 14, the register 31 may receive the first digital control signal corresponding to the power mode of the power amplifier 11 and the fifth digital control signal corresponding to the power mode of the power amplifier 14, and the register 131 may receive the second digital control signal corresponding to the power mode of the power amplifier 11 and the sixth digital control signal corresponding to the power mode of the power amplifier 14.

Accordingly, in a case that, or when, the radio-frequency module 1G transmits a signal in the first band, the bias circuits 21 and 121 are connected to the power amplifier 11 by the switch 95. Thus, in the power amplifier 11, the second bias current can be used as a current for adjusting the first bias current. On the other hand, in a case that, or when, the radio-frequency module 1G transmits a signal in the second band, the bias circuits 21 and 121 are connected to the power amplifier 14 by the switch 95. Thus, in the power amplifier 14, the second bias current can be used as a current for adjusting the first bias current. Thus, output power characteristics of the power amplifiers 11 and 14 can be stabilized.

Further, for example, the radio-frequency module 1H according to exemplary Modification 8 may further be provided with the first extraction circuit connected between the bias circuit 123 and the path connecting the bias circuit 21 and the power amplifier 11 and configured to extract at least a part of the first bias current from the above path.

Accordingly, in a case that, or when, the power mode of the power amplifier 11 is switched from the high power to the low power, a part of the first bias current supplied from the bias circuit 21 can be extracted in advance based on the second digital control signal. In other words, the second bias current which is negative can be used, based on the second digital control signal, as a current for adjusting the first bias current. Thus, since the first bias current can be reduced in advance, a trailing time of output power of the power amplifier 11 can be shortened.

Further, for example, in the radio-frequency module 1H according to exemplary Modification 8, the first extraction circuit may be provided with the FET 75 having the gate terminal connected to the bias circuit 123, the drain terminal connected to the above path and the source terminal connected to the ground.

Accordingly, an amount of extraction of the first bias current from the above path can be adjusted according to a control signal from the bias circuit 123.

Further, for example, the radio-frequency module 1J according to exemplary Modification 9 may further be provided with the switch 96 that is connected between the above path and each of the first extraction circuit and bias circuit 123 and switches between connection between the first extraction circuit and the above path and connection between the bias circuit 123 and the above path.

Accordingly, by switching the switch 96 in accordance with an instruction from the bias circuit 123, for example, the second bias current can be outputted from the bias circuit 123 as an adjustment current at a moment of a change from the low power mode to the high power mode, and a part of the first bias current can be extracted from the above path at a moment of a change from the high power mode to the low power mode.

Further, for example, in the radio-frequency module 1, the power amplifier 11, the bias circuits 21 and 23 and the bias control circuit 20 may be included in a single semiconductor IC 80.

Accordingly, the radio-frequency module 1 can be reduced in size.

Further, the communication device 4 according to the exemplary embodiment is provided with the RFIC 3 that processes a radio-frequency signal and the radio-frequency module 1 that transmits a radio-frequency signal between the RFIC 3 and the antenna 2.

Accordingly, the effect of the radio-frequency module 1 can be realized in the communication device 4.

Other Exemplary Embodiments

Although the radio-frequency module and the communication device according to the exemplary embodiment have been described above with reference to the exemplary embodiment and the exemplary modifications, the radio-frequency module and the communication device according to the present disclosure are not limited to the exemplary embodiment and the exemplary modifications described above. Other exemplary embodiments realized by combining arbitrary constituent elements in the above exemplary embodiment and modifications, exemplary modifications obtained by applying various exemplary modifications conceived by those skilled in the art to the above exemplary embodiment and modifications without departing from the scope of the present disclosure and various devices in which the above radio-frequency module and communication device are built-in are also included in the present disclosure.

For example, in the above radio-frequency module and communication device according to the exemplary embodiment and the exemplary modifications, other circuit elements, wiring lines or the like may be inserted between paths connecting the respective circuit elements and signal paths disclosed in the figures.

Additionally, although the configurations corresponding to the power modes of the power amplifiers have been described in the above exemplary embodiment, the configuration may be applied not only to a power amplifier but also to a low-noise amplifier disposed in a reception circuit. Note that the low-noise amplifier operates corresponding to a gain mode.

Characteristics of the radio-frequency module and the communication device described based on the above exemplary embodiment and modifications will be described below.

<1>
A radio-frequency module, including:
a first power amplifier;
a first bias circuit connected to the first power amplifier; and
a second bias circuit connected to the first power amplifier,
wherein the first bias circuit includes
a first register configured to receive a first digital control signal corresponding to a power mode of the first power amplifier, and
a first current generation circuit configured to generate, based on information in the first register, a first bias current, and
the second bias circuit includes
a second register configured to receive a second digital control signal corresponding to the power mode, and
a second current generation circuit configured to generate, based on information in the second register, a second bias current.

<2>
The radio-frequency module according to <1>,
wherein the second bias circuit is connected to a path connecting the first power amplifier and the first bias circuit.

<3>
The radio-frequency module according to <1> or <2>,
wherein the first current generation circuit includes
a first digital-to-analog (DA) converter connected to the first register, and
a first current source circuit connected to the first DA converter, and
the second current generation circuit includes
a second DA converter connected to the second register, and
a second current source circuit connected to the second DA converter.

<4>
The radio-frequency module according to <1> or <2>,
wherein the first current generation circuit includes
a first digital-to-analog (DA) converter connected to the first register and the second register, and
a first current source circuit connected to the first DA converter, and
the second current generation circuit includes a second current source circuit connected to the first DA converter.

<5>
The radio-frequency module according to any one of <1> to <4>, further including:
a control circuit configured to supply the first digital control signal to the first register and supply the second digital control signal to the second register.

<6>
The radio-frequency module according to <5>,
wherein the control circuit is further configured to
output the second digital control signal to the second register at first timing at which the power mode is switched to cause the second bias current to be outputted from the second bias circuit, and
output the first digital control signal to the first register at second timing after elapse of a predetermined time from the first timing to cause the first bias current to be outputted from the first bias circuit.

<7>

The radio-frequency module according to <6>, wherein the second bias current outputted according to the second digital control signal is smaller than the first bias current outputted according to the first digital control signal.

<8>

The radio-frequency module according to <6> or <7>, wherein the control circuit is further configured to
output the first digital control signal to the first register at the second timing, and
output, to the second register, the second digital control signal to stop supply of the second bias current.

<9>

The radio-frequency module according to <1>, further including:
a second power amplifier cascade-connected to the first power amplifier; and
a third bias circuit connected to the second power amplifier,
wherein the third bias circuit includes
a third register configured to receive a third digital control signal corresponding to a power mode of the second power amplifier, and
a third current generation circuit configured to generate, based on information in the third register, a third bias current,
the second bias circuit is connected to the first power amplifier and the second power amplifier, and
the second register is configured to receive the second digital control signal corresponding to the power mode of the first power amplifier and a fourth digital control signal corresponding to the power mode of the second power amplifier.

<10>

The radio-frequency module according to <1>, further including:
a second power amplifier cascade-connected to the first power amplifier;
a third bias circuit connected to the second power amplifier; and
a fourth bias circuit connected to the second power amplifier,
wherein the third bias circuit includes
a third register configured to receive a third digital control signal corresponding to a power mode of the second power amplifier, and
a third current generation circuit configured to generate, based on information in the third register, a third bias current, and
the fourth bias circuit includes
a fourth register configured to receive a fourth digital control signal corresponding to the power mode, and
a fourth current generation circuit configured to generate, based on information in the fourth register, a fourth bias current.

<11>

The radio-frequency module according to <1>, further including:
a third power amplifier; and
a first switch connected between the first bias circuit and each of the first power amplifier and the third power amplifier, and configured to switch connection between the first power amplifier and each of the first bias circuit and the second bias circuit and connection between the third power amplifier and each of the first bias circuit and the second bias circuit,
wherein the first register is configured to receive the first digital control signal corresponding to the power mode of the first power amplifier and a fifth digital control signal corresponding to a power mode of the third power amplifier, and
the second register is configured to receive the second digital control signal corresponding to the power mode of the first power amplifier and a sixth digital control signal corresponding to the power mode of the third power amplifier.

<12>

The radio-frequency module according to <1>, further including:
a third power amplifier; and
a second switch connected between the second bias circuit and each of the first power amplifier and the third power amplifier and configured to switch connection between the second bias circuit and the first power amplifier and connection between the second bias circuit and the third power amplifier,
wherein the second register is configured to receive the second digital control signal corresponding to the power mode of the first power amplifier and a sixth digital control signal corresponding to a power mode of the third power amplifier.

<13>

The radio-frequency module according to <1>, further including:
a third power amplifier; and
a third switch connected between each of the first bias circuit and the second bias circuit and each of the first power amplifier and the third power amplifier and configured to switch connection between the first power amplifier and each of the first bias circuit and the second bias circuit and connection between the third power amplifier and each of the first bias circuit and the second bias circuit,
wherein the first register is configured to receive the first digital control signal corresponding to the power mode of the first power amplifier and a fifth digital control signal corresponding to a power mode of the third power amplifier, and
the second register is configured to receive the second digital control signal corresponding to the power mode of the first power amplifier and a sixth digital control signal corresponding to the power mode of the third power amplifier.

<14>

The radio-frequency module according to <1>, further including:
a first extraction circuit connected between the second bias circuit and a path connecting the first bias circuit and the first power amplifier and configured to extract at least a part of the first bias current from the path.

<15>

The radio-frequency module according to <14>, wherein the first extraction circuit is provided with a first transistor including
a first control terminal connected to the second bias circuit,
a first terminal connected to the path, and
a second terminal connected to a ground.

<16>

The radio-frequency module according to <14> or <15>, further including:

a fourth switch connected between the path and each of the first extraction circuit and the second bias circuit and configured to switch connection between the first extraction circuit and the path and connection between the second bias circuit and the path.

<17>

The radio-frequency module according to <5>, wherein the first power amplifier, the first bias circuit, the second bias circuit and the control circuit are included in one semiconductor integrated circuit (IC).

<18>

A communication device, including:

a signal processing circuit configured to process a radio-frequency signal; and the radio-frequency module according to any one of <1> to <17> configured to transmit the radio-frequency signal between the signal processing circuit and an antenna.

The present disclosure can be widely used in communication devices such as mobile phones as a power amplifier circuit disposed in a front end unit compatible with multi-band or as a communication device.

What is claimed is:

1. A radio-frequency module, comprising:

a first power amplifier;

a first bias circuit connected to the first power amplifier; and a second bias circuit connected to the first power amplifier, wherein the first bias circuit includes a first register configured to receive a first digital control signal corresponding to a power mode of the first power amplifier, and a first current generation circuit configured to generate, based on information in the first register, a first bias current, and the second bias circuit includes a second register configured to receive a second digital control signal corresponding to the power mode, the second digital control signal being different from the first digital control signal, and a second current generation circuit configured to generate, based on information in the second register, a second bias current, wherein the radio-frequency module further includes a control circuit configured to supply the first digital control signal to the first register and supply the second digital control signal to the second register, a first control signal path is connected between the control circuit and the first register, and a second control signal path, which is different from the first control path, is connected between the control circuit and the second register, and the control circuit is further configured to:

output the second digital control signal to the second register at first timing at which the power mode is switched to cause the second bias current to be outputted from the second bias circuit, and output the first digital control signal to the first register at second timing after elapse of a predetermined time from the first timing to cause the first bias current to be outputted from the first bias circuit.

2. The radio-frequency module according to claim 1, wherein the second bias circuit is connected to a path connecting the first power amplifier and the first bias circuit.

3. The radio-frequency module according to claim 1, wherein the first current generation circuit includes a first digital-to-analog (DA) converter connected to the first register, and a first current source circuit connected to the first DA converter, and the second current generation circuit includes a second DA converter connected to the second register, and a second current source circuit connected to the second DA converter.

4. The radio-frequency module according to claim 1, wherein the first current generation circuit includes a first digital-to-analog (DA) converter connected to the first register and the second register, and a first current source circuit connected to the first DA converter, and the second current generation circuit has a second current source circuit connected to the first DA converter.

5. The radio-frequency module according to claim 1, wherein the second bias current outputted according to the second digital control signal is smaller than the first bias current outputted according to the first digital control signal.

6. The radio-frequency module according to claim 1, wherein the control circuit is further configured to output the first digital control signal to the first register at the second timing, and output, to the second register, the second digital control signal for stopping supply of the second bias current.

7. The radio-frequency module according to claim 1, further comprising:

a second power amplifier cascade-connected to the first power amplifier; and a third bias circuit connected to the second power amplifier, wherein the third bias circuit includes a third register configured to receive a third digital control signal corresponding to a power mode of the second power amplifier, and a third current generation circuit configured to generate, based on information in the third register, a third bias current, the second bias circuit is connected to the first power amplifier and the second power amplifier, and the second register is configured to receive the second digital control signal corresponding to the power mode of the first power amplifier and a fourth digital control signal corresponding to the power mode of the second power amplifier.

8. The radio-frequency module according to claim 1, further comprising:

a second power amplifier cascade-connected to the first power amplifier;

a third bias circuit connected to the second power amplifier; and a fourth bias circuit connected to the second power amplifier, wherein the third bias circuit includes a third register configured to receive a third digital control signal corresponding to a power mode of the second power amplifier, and a third current generation circuit configured to generate, based on information in the third register, a third bias current, and the fourth bias circuit includes a fourth register that receives a fourth digital control signal corresponding to the power mode, and a fourth current generation circuit configured to generate, based on information in the fourth register, a fourth bias current.

9. The radio-frequency module according to claim 1, further comprising:

a third power amplifier; and a first switch connected between the first bias circuit and each of the first power amplifier and the third power amplifier, and configured to switch connection between the first power amplifier and each of the first bias circuit and the second bias circuit and connection between the third power amplifier and each of the first bias circuit and the second bias circuit, wherein the first register is configured to receive the first digital control signal corresponding to the power mode of the first power amplifier and a fifth digital control signal corresponding to a power mode of the third power amplifier, and the second register is configured to receive the second digital control signal corresponding to the power mode of the first power amplifier and a sixth digital control signal corresponding to the power mode of the third power amplifier.

10. The radio-frequency module according to claim 1, further comprising:

a third power amplifier; and a second switch connected between the second bias circuit and each of the first power amplifier and the third power amplifier and configured to switch connection between the second bias circuit and the first power amplifier and connection between the second bias circuit and the third power amplifier, wherein the second register is configured to receive the second digital control signal corresponding to the power mode of the first power amplifier and a sixth digital control signal corresponding to a power mode of the third power amplifier.

11. The radio-frequency module according to claim 1, further comprising:

a third power amplifier; and a third switch connected between each of the first bias circuit and the second bias circuit and each of the first power amplifier and the third power amplifier and configured to switch connection between the first power amplifier and each of the first bias circuit and the second bias circuit and connection between the third power amplifier and each of the first bias circuit and the second bias circuit, wherein the first register is configured to receive the first digital control signal corresponding to the power mode of the first power amplifier and a fifth digital control signal corresponding to a power mode of the third power amplifier, and the second register is configured to receive the second digital control signal corresponding to the power mode of the first power amplifier and a sixth digital control signal corresponding to the power mode of the third power amplifier.

12. The radio-frequency module according to claim 1, further comprising:

a first extraction circuit connected between the second bias circuit and a path connecting the first bias circuit and the first power amplifier and configured to extract at least a part of the first bias current from the path.

13. The radio-frequency module according to claim 12, wherein the first extraction circuit is provided with a first transistor including a first control terminal connected to the second bias circuit, a first terminal connected to the path, and a second terminal connected to ground.

14. The radio-frequency module according to claim 12, further comprising:

a fourth switch connected between the path and each of the first extraction circuit and the second bias circuit and configured to switch connection between the first extraction circuit and the path and connection between the second bias circuit and the path.

15. The radio-frequency module according to claim 1, wherein the first power amplifier, the first bias circuit, the second bias circuit and the control circuit are included in one semiconductor integrated circuit (IC).

16. The radio-frequency module according to claim 1, further comprising:

an impedance matching circuit connected to an input of the power amplifier and configured to match an impedance between an radio-frequency integrated circuit (RFIC) output terminal and an input terminal of the power amplifier.

17. The radio-frequency module according to claim 1, comprising:

a filter circuit connected between an output of the power amplifier and an antenna and configured to filter an output of the power amplifier according to a predetermined passband.

18. A communication device, comprising:

a signal processing circuit configured to process a radio-frequency signal; and the radio-frequency module according to claim 1 configured to transmit the radio-frequency signal between the signal processing circuit and an antenna.

* * * * *